(12) United States Patent
La Rosa et al.

(10) Patent No.: US 7,791,953 B2
(45) Date of Patent: Sep. 7, 2010

(54) FAST ERASABLE NON-VOLATILE MEMORY

(75) Inventors: Francesco La Rosa, Rousset (FR); Antonino Conte, Tremestieri Etneo (IT)

(73) Assignees: STMicroelectronics SA, Montrouge (FR); STMicroelectronics S.r.l., Agrate Brianza (IT)

( * ) Notice: Subject to any disclaimer, the term of this patent is extended or adjusted under 35 U.S.C. 154(b) by 181 days.

(21) Appl. No.: 12/113,692

(22) Filed: May 1, 2008

(65) Prior Publication Data

US 2008/0273400 A1 Nov. 6, 2008

(30) Foreign Application Priority Data

| May 2, 2007 | (FR) | ................................. 07 03152 |
| May 2, 2007 | (FR) | ................................. 07 03153 |
| May 2, 2007 | (FR) | ................................. 07 03154 |

(51) Int. Cl.
  *G11C 16/04* (2006.01)
(52) U.S. Cl. .................... 365/185.29; 365/185.09; 365/185.11; 365/185.28
(58) Field of Classification Search .......... 365/185.09, 365/185.11, 185.28, 185.29
  See application file for complete search history.

(56) References Cited

U.S. PATENT DOCUMENTS

| 5,694,538 | A | 12/1997 | Okazaki et al. |
| 6,212,105 | B1 | 4/2001 | Kowalski |
| 6,807,103 | B2 | 10/2004 | Cavaleri et al. |
| 6,839,285 | B2 | 1/2005 | Zink et al. |
| 7,079,448 | B2 | 7/2006 | Leconte et al. |
| 2003/0145160 | A1 | 7/2003 | Baba |
| 2004/0114431 | A1 | 6/2004 | Shona |
| 2005/0251643 | A1 | 11/2005 | Dirscherl et al. |
| 2007/0147168 | A1* | 6/2007 | Pinto et al. .................. 365/236 |

* cited by examiner

*Primary Examiner*—Hoai V Ho
(74) *Attorney, Agent, or Firm*—Lisa K. Jorgenson; Robert Iannucci; Seed IP Law Group PLLC

(57) ABSTRACT

A method writes data in a non-volatile memory comprising a main memory area comprising target locations, and an auxiliary memory area comprising auxiliary locations. The method comprises a write-erase cycle comprising: reading an initial set of data in a source location located in the main or auxiliary memory area; inserting the piece of data to be written into the initial set of data, to obtain an updated set of data, partially erasing a first group of auxiliary locations and a group of target locations designated by locations of a second group of auxiliary locations, and writing, in an erased auxiliary location of a third group of auxiliary locations, the updated set of data and the address of the target location. The method is particularly applicable to FLASH memories.

30 Claims, 30 Drawing Sheets

| Status of a page of an auxiliary sector | CS (Copy Start) | COK (Copy OK) | IS (Invalidation Start) | IOK (Invalidation OK) | MER (Main Erased) |
|---|---|---|---|---|---|
| Erased (available) | 1 | 1 | 1 | 1 | X |
| Data copy in progress | 0 | 1 | 1 | 1 | X |
| Valid page | 0 | 0 | 1 | 1 | X |
| Invalidation in progress | 0 | 0 | 0 | 1 | X |
| Invalidated | 0 | 0 | 0 | 0 | X |
| Corresponding page in MA not erased | | | | | 1 |
| Corresponding page in MA erased or being erased | | | | | 0 |
Fig 3
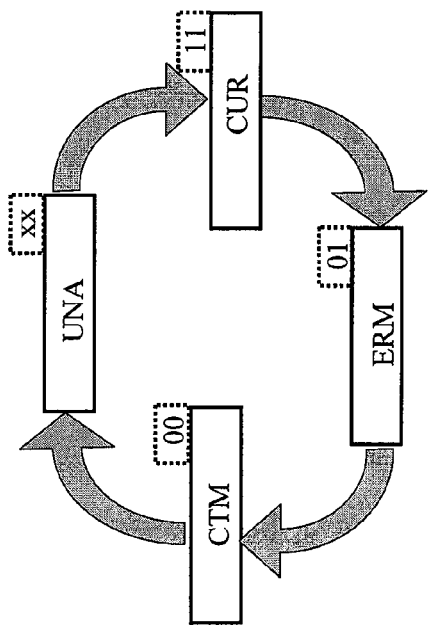
Fig 5
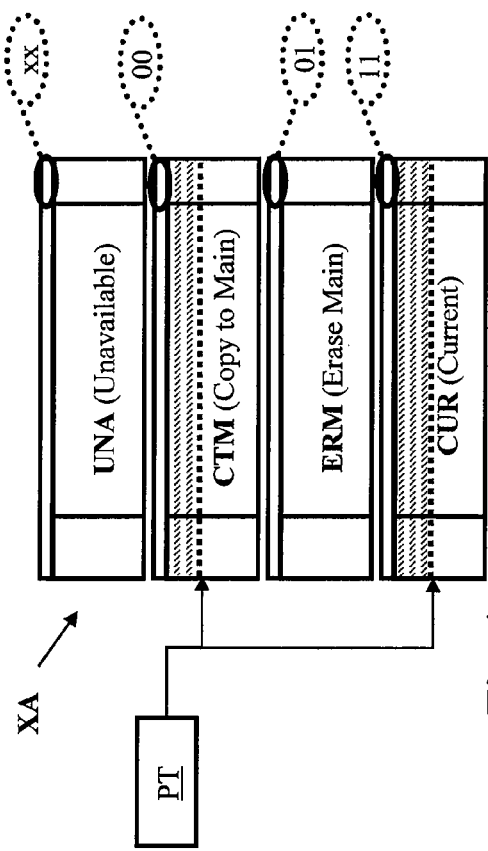
Fig. 4

FAST ERASABLE NON-VOLATILE MEMORY

BACKGROUND

1. Technical Field

The present invention relates to non-volatile memories and in particular to electrically erasable and programmable memories of FLASH type.

2. Description of the Related Art

The market of electrically erasable and programmable memories on silicon chips is traditionally shared between the EEPROM memory family and the FLASH memory family (or FLASH-EEPROM).

EEPROM memories comprise memory cells comprising a floating gate transistor and an access transistor. Gate control transistors allow an erasing voltage to be applied to groups of memory cells or words comprising a small number of memory cells, for example from 8 to 16 memory cells. They thus have a very fine granularity in erasure. In addition, the access transistors insulate the floating gate transistors from bit lines and allow threshold voltages of different signs to be provided between erased memory cells and programmed memory cells. These memories are thus easy to implement but the memory cells occupy a significant surface due to their two-transistor structure.

FLASH-type memories only comprise one floating gate transistor by memory cell and thus have the advantage of being very compact in terms of surface of silicon occupied (number of memory cells per surface unit). On the other hand, the absence of access transistor requires positive threshold voltages for erased memory cells as well as for programmed memory cells, in order not to generate short circuits on the bit lines. Gate oxides must thus be thick to durably maintain the electric charges stuck in the floating gates, which causes a notable increase of the erasure time. More particularly, the erasure of FLASH memory cells is usually performed by tunnel effect while the writing thereof (programming) is performed by injecting hot electrons. The time required for writing memory cells is short, for example 5 microseconds, while the erasure time is long, for example 100 milliseconds. In addition, programming by injecting hot electrons causes the apparition of a high programming current, so that the number of memory cells which can be simultaneously written must be limited. Thus, writing memory cells is usually performed word by word, contrary to EEPROM memories which allow a whole page to be simultaneously written. Eventually, FLASH memories are only erasable by sector, a sector comprising transistors which low-potential terminals (source terminals for NMOS-type transistors) are linked to the same substrate.

FLASH memories have thus been originally dedicated to bulk storage. Various improvements were then suggested so that they could offer features coming closer to EEPROM memories, to open to FLASH memories application fields originally allotted to EEPROM memories. Globally, the aim of these improvements is to offer FLASH memories able to compete with EEPROM memories in terms of flexibility of use, without losing their advantages in terms of storage capacity per unit of silicon surface.

Among the improvements that have allowed the market of FLASH memories to evolve, the following can be quoted:

the design of a FLASH memory programmable by page, such as described by U.S. Pat. No. 6,839,285, assigned to STMicroelectronics S.A., which is the assignee of the present application. Such a memory comprises a volatile page buffer allowing it to receive data representing a whole page. An internal algorithm (executed by a wired-logic sequencer or a microprocessor) performs writing the page word by word but in a transparent way for the user, who is thus offered the ability to write a whole sector page by page instead of writing it word by word;

the design of a FLASH memory erasable by page, such as described by U.S. Pat. No. 6,807,103, assigned to STMicroelectronics S.A. In such a memory, inhibit voltages are applied to the memory cells which must not be erased within a sector being erased. An erase granularity is obtained which is not as fine as that of an EEPROM memory but which tends thereto (although some EEPROM memories are also erasable by page and not by word). Thanks to the inhibit voltages, the erasure step can be controlled in order to simultaneously erase one or more pages within a same sector, without affecting the other pages of the same sector;

the design of a FLASH memory programmable by word and erasable by page, or page-FLASH, such as described by U.S. Pat. No. 7,079,448, assigned to STMicroelectronics S.A. Such a memory also comprises a page buffer but the process of erasure by page according to U.S. Pat. No. 6,807,103 is combined with an internal algorithm simulating writing by word. The internal algorithm retrieves the words present in a target page and saves them in the page buffer with the new word(s) supplied by the user, to obtain an updated page. The target page is erased and the updated page is written therein, so that the target page then comprises the new word(s) and some words that were present in the initial page. The user may thus apply a command for writing a word without worrying about previously erasing the page, which is performed by the algorithm.

This latest improvement has made it possible to commercialize FLASH memories with the same apparent functionalities as EEPROM memories, but in which some limitations remain, i.e.:

the long erasure time, which may be annoying for some applications. Indeed, the apparent time for writing a word is mainly imposed by the time for erasing the page, since the internal algorithm must erase the whole page each time a new word is written;

no protection against inopportune power interruptions. Indeed, if a power interruption occurs while erasing the target page and while the updated page is still in the volatile page buffer, all the data of the page are irreparably lost. Consequently FLASH memories cannot currently be used as embedded memories in integrated circuits intended for applications where the risk of power interruption is high. The applications typically are chip cards or electronic tags, in which the integrated circuits are powered by an external device (reader) and can disappear anytime in case of "tear off" (removing the card from the slot of the reader for a contact card, quickly taking the card away from the coil of the reader for an inductive coupling contactless card, etc.).

It may thus be wished to improve FLASH-type memories and globally any type of non-volatile memory having all or part of the aforementioned features, according to at least one of the following improvement axes of:

enhancing the apparent time of data erasure;

enhancing the apparent time of data erasure without having to disrupt a flow of instructions;

protecting data against the risk of power interruption during the writing process.

Each improvement axis is aimed at independently of the others or in combination with the others according to the applications concerned.

Regarding data protection against power interruptions, the patent application US2005/0251643 relates to a method of tearing proof programming (paragraph 0008) adapted to FLASH memories. The pages of the memory are used to memorize, in addition to useful data, a logic address of page and a count value. A look-up table allows a logic address and a physical address (electric address) to be associated. When a piece of data must be written in a page, the content of the page is copied out in a page buffer. The new piece of data is incorporated therein, while the count value is incremented. The updated content of the page is then written in another page, of the same logic address. The initial page is then erased. In summary, the pages are indexed in physical pages of any address and can be identified only from the logic address thereof. The fact of erasing the initial page after saving the updating in another physical page makes it possible to overcome the risk of losing data in the event of a power interruption during or after erasing the initial page. In case of doubt on the identity of the valid page at powering up, when two pages of same logic address are in the memory, the latest page is the one containing the highest count value.

This method requires managing a count value which must necessarily pass by zero, the size of the count field not being infinite, so that a new count value after reset may have a value inferior to a previous count value generated before reset. In addition, if a power interruption occurs while the initial page is being erased, the memory cells of the page are not completely erased. The data they comprise may have erroneous values, due to the fact that electric charges in the memory cells are undetermined as long as the erase process is not completed. Thus, after powering up after a power interruption, a count value read in incompletely erased memory cells may have an arbitrary value greater than the count value in the latest updated page. In these conditions, the old incompletely erased page comprising invalid data may be seen as the "good" page, while the true "good" page may be erased.

About the decrease in apparent erasure time, it appears that the writing method described in US2005/0251643 is based on an elementary step of writing new data without erasing previous data. It can be seen that this elementary step allows the apparent time for erasing a page to be reduced since writing updated page data is performed without previously erasing the initial page. However, it is not conceivable to permanently write data in erased pages, unless an infinite memory space is provided. The writing process may thus be interrupted, at a given time, to erase invalidated pages and to free memory space. Now, such an interruption may be not wished or not conceivable in some applications, in particular applications that require managing an uninterrupted flow of writing instructions.

Such an elementary step is also taught by the U.S. Pat. No. 6,212,105, but is implemented differently: when a new piece of data must be written, the new piece of data is temporarily written in an auxiliary location and the target location is erased; then the piece of data is written in the erased target location and the auxiliary location is erased. This method requires two consecutive erasure steps so that a piece of data is memorized in a target location, and is not adapted to memories with an erasure time greater than the writing time.

BRIEF SUMMARY

One embodiment of the invention relates to a method for writing data in a non-volatile memory comprising a main memory area comprising target locations, and an auxiliary memory area comprising auxiliary locations, wherein a piece of data to be written comes with an address of a target location. The method comprises a write-erase cycle comprising: reading an initial set of data in a source location located in the main or auxiliary memory area; inserting the piece of data to be written into the initial set of data, to obtain an updated set of data; partially erasing a first group of auxiliary locations and a group of target locations designated by locations of a second group of auxiliary locations; and writing, in an erased auxiliary location of a third group of auxiliary locations, the updated set of data and the address of the target location, so that after several steps of writing data in erased locations of the third group of locations, the locations of the first group of auxiliary locations and the group of target locations designated by the second group of auxiliary locations are completely erased.

According to one embodiment, the write-erase cycle further comprises transferring, to a target location, a piece of data located in an auxiliary location of a fourth group of auxiliary locations, if the piece of data is not declared invalid, and declaring invalid the auxiliary location of the fourth group of auxiliary locations when the piece of data has been transferred to the target location.

According to one embodiment, the write-erase cycle further comprises declaring as invalid the source location located in the main or auxiliary memory area.

According to one embodiment, the first group of locations comprises the same number of locations as the number of steps of partial erasure required to completely erase the first group of locations.

According to one embodiment, the write-erase cycle further comprises declaring as invalid the target location.

According to one embodiment, the method comprises determining whether an area that must receive the piece of data in the target location is erased; if the area is erased, directly writing the piece of data in the target location and not triggering the write-erase cycle; and if the area is not erased, triggering the write-erase cycle to write the piece of data in an auxiliary location.

According to one embodiment, the method comprises providing, in the auxiliary memory area: a current sector forming the third group of auxiliary locations and comprising auxiliary locations in the erased state; a save sector forming the second group of auxiliary locations and comprising auxiliary locations containing data linked to target locations to which steps of partial erasure are applied and the addresses of the target locations to which steps of partial erasure are applied; a transfer sector forming the fourth group of auxiliary locations and comprising auxiliary locations containing data to be transferred to the respective target locations thereof; and an unavailable sector forming the first group of auxiliary locations and comprising invalid auxiliary locations to which steps of partial erasure are applied.

According to one embodiment, the method comprises, after completely erasing the unavailable sector, rotating sectors comprising: declaring as current sector the sector previously unavailable; declaring as save sector the sector previously current; declaring as transfer sector the sector previously save; and declaring as unavailable sector the sector previously transfer.

One embodiment of the invention also relates to a non-volatile memory comprising a main memory area comprising target locations, and an auxiliary memory area comprising auxiliary locations, the target and auxiliary locations comprising memory cells that must be erased before being written, the memory comprising a control unit configured to, upon receiving a command for writing a piece of data coming with an address of the target location in a target location, apply to the memory a write-erase cycle comprising: reading an initial set of data in a source location located in the main or auxiliary memory area; inserting the piece of data to be written into the initial set of data, to obtain an updated set of data; partially erasing a first group of auxiliary locations and a group of target locations designated by locations of a second group of auxiliary locations; and writing, in an erased auxiliary location of a third group of auxiliary locations, the updated set of data and the address of the target location, so that after several steps of writing data in erased locations of the third group of locations, the locations of the first group of auxiliary locations and the group of target locations designated by the second group of auxiliary locations are completely erased.

According to one embodiment, the control unit is configured to include into the write-erase cycle a step of transferring, to a target location, a piece of data located in an auxiliary location of a fourth group of auxiliary locations if the piece of data is not declared invalid, and a step of declaring invalid the auxiliary location of the fourth group of auxiliary locations when the piece of data has been transferred to the target location.

According to one embodiment, the control unit is configured to include into the write-erase cycle a step of declaring invalid the source location located in the main or auxiliary memory area.

According to one embodiment, the group of locations comprises the same number of locations as the number of steps of partial erasure required to completely erase the group of locations.

According to one embodiment, the control unit is configured to include into the write-erase cycle a step of declaring as invalid the target location.

According to one embodiment, each location comprises at least one invalidation flag, and the control unit is configured to invalidate a location by setting at least one flag at a programming logic value.

According to one embodiment, the control unit is configured to, in response to a writing command:
  determine whether an area which must receive the piece of data in the target location is erased,
  if the area is erased, directly write the piece of data in the target location and not trigger the write-erase cycle, and
  if the area is not erased, trigger the write-erase cycle to write the piece of data in an auxiliary location.

According to one embodiment, the auxiliary memory area comprises: a current sector forming the third group of auxiliary locations and comprising erased auxiliary locations used by the control unit to write data; a save sector forming the second group of auxiliary locations and comprising auxiliary locations containing data linked to target locations to which the control unit applies steps of partial erasure and the addresses of the target locations; a transfer sector forming the fourth group of auxiliary locations and comprising auxiliary locations containing data to be transferred to the respective target locations thereof; and an unavailable sector forming the first group of auxiliary locations and comprising invalid auxiliary locations to which the control unit applies steps of partial erasure.

According to one embodiment, the control unit is configured to, after completely erasing the unavailable sector: declare as current sector the sector previously unavailable; declare as save sector the sector previously current; declare as transfer sector the sector previously save; and declare as unavailable sector the sector previously transfer.

According to one embodiment, a location is the smallest set of memory cells which may be erased individually.

According to one embodiment, a location is a page of the memory defined by a row address.

One embodiment of the invention also relates to an integrated circuit, comprising a memory of the type described above.

One embodiment of the invention also relates to a chipcard or an electronic tag comprising an integrated circuit of the type described above.

BRIEF DESCRIPTION OF THE SEVERAL VIEWS OF THE DRAWINGS

The following description is made in relation with, but not limited to the appended figures wherein:

FIG. 3 is a table showing the use of control flags provided in the memory, FIG. 4 shows an organization in sectors of the auxiliary memory area, FIG. 5 shows a step of rotating sectors according to one embodiment of a method of the invention.

DETAILED DESCRIPTION

A—Global Description

One embodiment of a memory schematically shown in FIG. 1 and shown in further details in FIG. 6 will be described hereinafter. However, as it will be clear to those skilled in the art upon reading the following, each aspect of the embodiment is susceptible of a proper implementation that may lead to some embodiments different of that which will be described.

Figure 1:
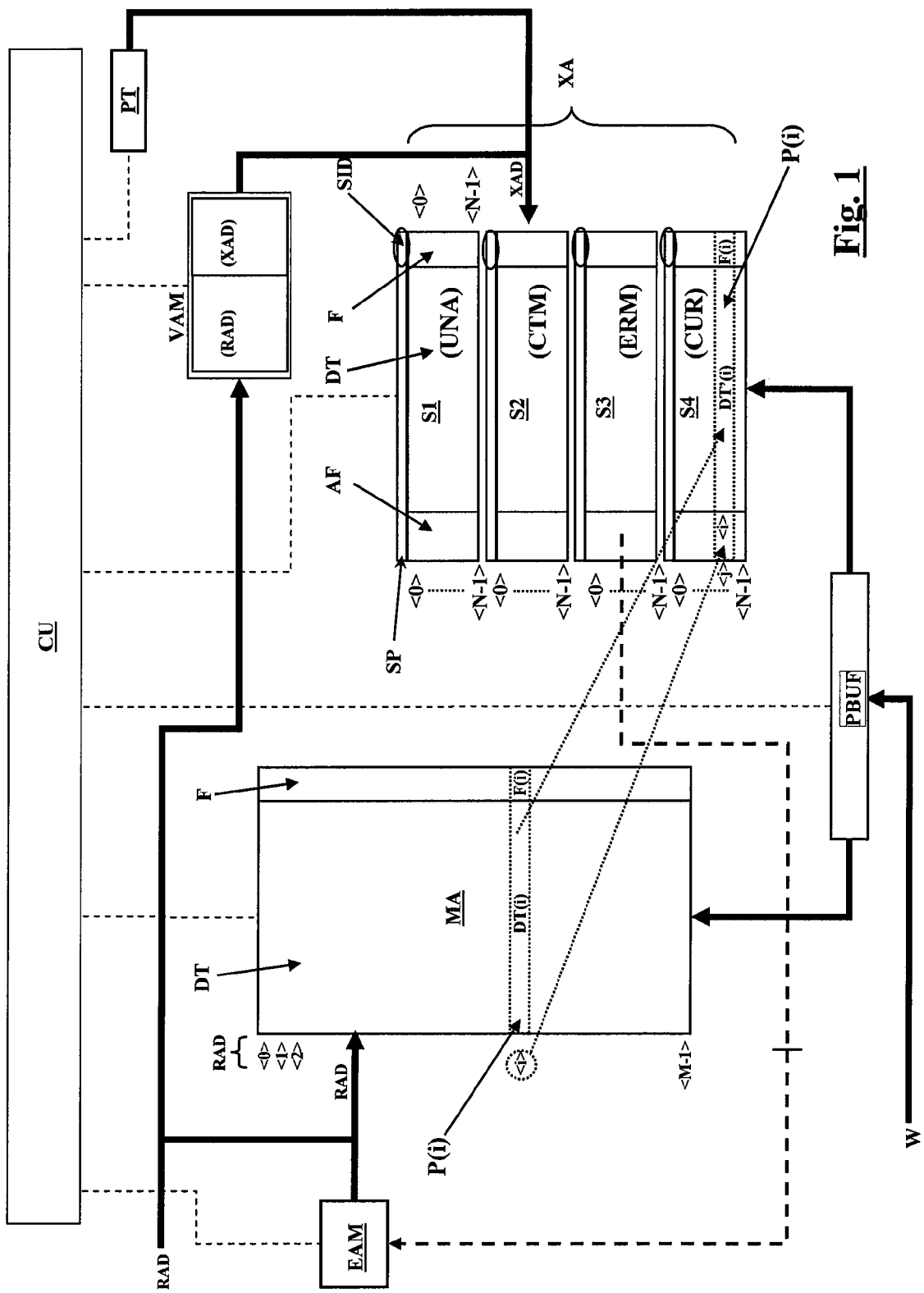
FIG. 1 schematically shows an embodiment of a memory according to the invention.

The memory shown in FIG. 1 comprises a main memory area MA, or MA area, and an auxiliary memory area, or XA area. The memory areas MA, XA are of non-volatile type and are electrically erasable and programmable. They are here of page-FLASH type, i.e., divided into individually erasable pages or erasable by groups of individually selected pages. Each page is divided into segments that may be individually written and each provided to receive a binary word (for example a byte). The MA area comprises target pages and the XA area comprises auxiliary pages.

i) Updating Target Pages in the Auxiliary Pages

The XA area is used to update target pages, without having to previously erase these pages. Thus, in response to a command for writing one or more words W in a target page P(i), the data of the page, after updating, are written in the XA area. Updating the data of the page is performed in a page buffer PBUF: the content of the target page P(i) is copied out in the page buffer PBUF, and the new word(s) W are inserted into the page buffer (the old words being overwritten). The updated content of the page buffer is then written in an erased page of the XA area, or landing page, and the target page is invalidated.

An auxiliary page may be updated the same way, if the corresponding target page in the MA area is invalid. The content of the auxiliary page is in this case put in the buffer PBUF, is updated therein, and is written in another auxiliary page in the erased state. The initial auxiliary page is then invalidated.

Thus, to execute a write command in a target page, the source page (page of which content is requested to be updated) may be located in the MA area or the XA area, while the landing page is located in the XA area. In the first case, the source page is the target page aimed at by the command, while in the second case the source page is an auxiliary page linked to the target page. For simplicity reasons, the following terms will be thus differentiated hereinafter:

target page: page of the MA area (in particular a page designated by a command),
 source page: page of the MA area or the XA area whose content is requested to be updated (a source page being a target page if it is located in the MA area),
 landing page: page in which the data of the source page are written after updating.

Updating a source page by transferring the data thereof to an auxiliary page may however not be required if the target area, i.e., the segment of the source page requested to receive a new piece of data, is in the erased state. This point will be further detailed hereinafter (see "Testing the target area").

ii) Auxiliary Pages Comprising an Address Field

The target pages are selected using addresses RAD and the auxiliary pages are selected using addresses XAD. The MA area has for example an address field going from 0 to M−1. The target pages and auxiliary pages comprise each a data field DT. According to one embodiment, the auxiliary pages further comprise an address field AF. This address field receives the address of the target pages with which the auxiliary pages are associated, and allows the updated content of a target page to be written in the XA area while keeping information linking the target page to the auxiliary page, and performing the traceability of the content transfer. Thus, when the data comprised in a target page of address <i> are written, after updating, in a page of the XA area, the auxiliary page differs from the target page in that it contains the address <i> of the target page in the address field AF thereof and in that it contains updated data.

Hereinafter, to make language simpler, an auxiliary page of physical address <j> (electric address) containing the address <i> in the address field thereof is considered to be a page of address <i>. Two auxiliary pages, or more, may likewise have the same address <i> as a target page. The address <i> is a virtual address as far as an auxiliary page is concerned and a physical address as far as a target page is concerned.

A valid address map VAM is provided to link the addresses RAD of target pages updated in the XA area, and the physical addresses XAD of the corresponding pages of the XA area. The map VAM is a look-up table which receives addresses RAD applied to the MA area and automatically converts them to XAD addresses. The map VAM only comprises addresses XAD corresponding to valid auxiliary pages, the addresses of invalid auxiliary pages being suppressed in real time from the map, so that each address XAD present in the map VAM matches one address RAD only. On the other hand, each address RAD present in the map does not necessarily match an address XAD, if the target page of address RAD is valid.

iii) Control Fields

According to one embodiment, the target pages and auxiliary pages also comprise a control field F. Thus, a page P(i) of address i in the MA area comprises a data field DT(i) and a control field F(i), and a page P(i) of virtual address i in the XA area comprises an address field AF(i) comprising the physical address <i>, a data field DT(i) and a control field F(i).

The control fields F of the MA area and the XA area are used to validate or invalidate the pages, ensuring that two pages of same address <i> of the MA area and the XA area, or two pages of same address <i> of the XA area, are not valid at the same time. Thus, if valid data DT (i) are in an auxiliary page P (i) instead of being in the target page P(i) of address <i>, the target page is invalid whereas the auxiliary page is valid. Likewise, if two auxiliary pages have the same address <i> in address field thereof and are thus linked to the same target page, one page out of the tree may be valid.

The control fields are also used here to differentiate a page completely erased and a valid page which has received data.

Figure 2:
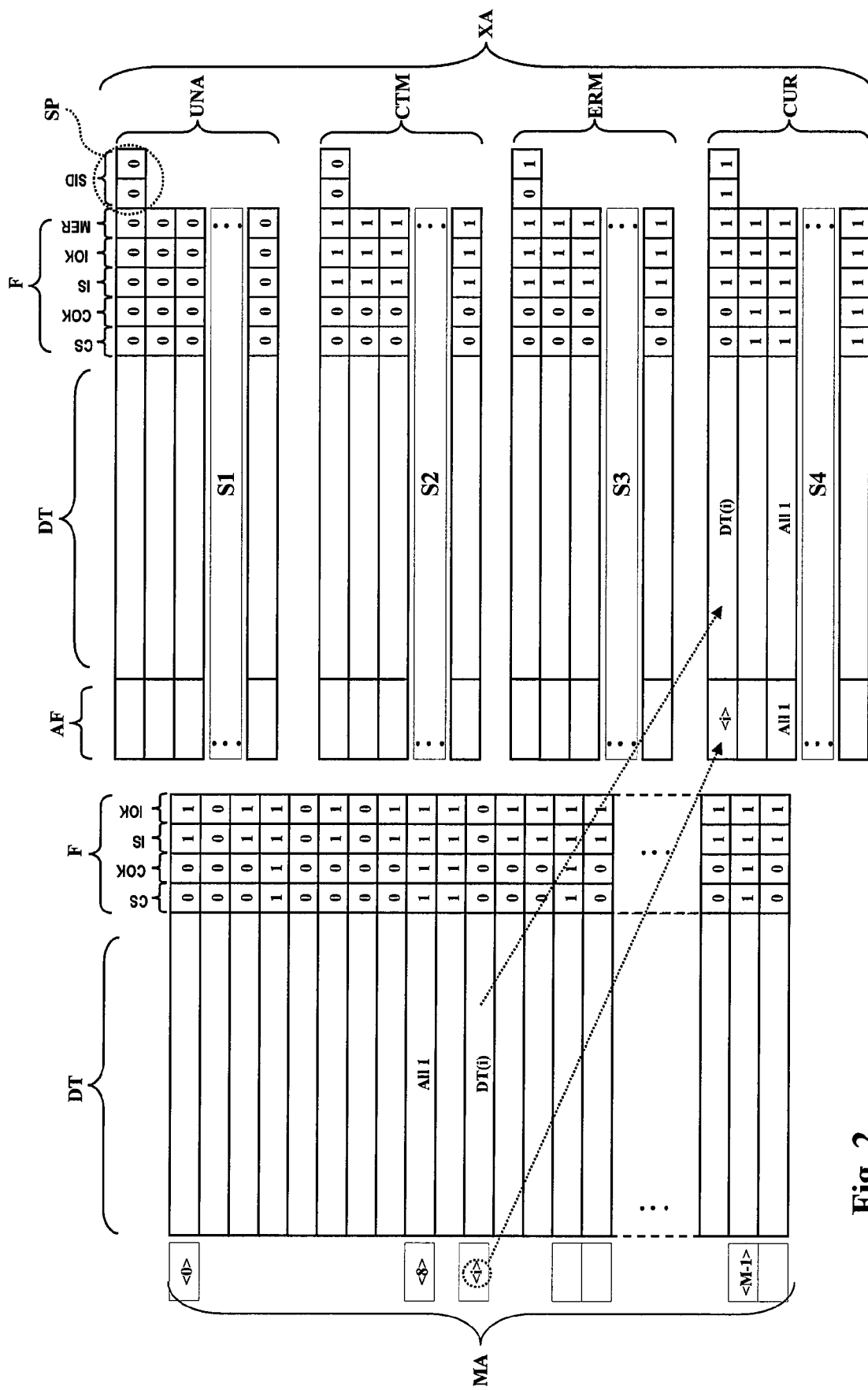
FIG. 2 shows in further details the structure of a main memory area and an auxiliary memory area shown in block form in FIG. 1.

An example configuration of the control fields F of the areas MA, XA is shown in FIG. 2. FIG. 2 is a picture of the content of the areas MA, XA at anytime. The data they comprise are not shown except for values in the control fields. The control field of the auxiliary pages comprises the following flags:

CS ("Copy Start"),
 COK ("Copy OK"),
 IS ("Invalidation Start"),
 IOK ("Invalidation OK"),
 MER ("Main Erased").

The control field of the target pages comprises the flags CS, COK, IS, IOK and does not comprise the flag MER.

FIG. 3 is a table showing the encoding of the control field of the auxiliary pages. The encoding of the control field of the target pages is identical to that of the auxiliary pages in that it concerns the flags CS, COK, IS, IOK. Each flag has an active value which is the programming logic value. The programming logic value depends on the polarity given to sense amplifiers and is defined by convention. It will be assumed hereinafter that the logic "0" is the programming logic value (value of a bit after writing), the logic "1" thus being the erasing logic value (value of an erased bit). The meaning given to the flags is the following:

the flag CS equal to 0 indicates that the data are going to be copied out in the page,
 the flag COK equal to 0 indicates that the data have been copied out in the page,
 the flag IS equal to 0 indicates that the page is going to be invalidated,
 the flag IOK equal to 0 indicates that the page is invalidated.

In addition, the flag MER equal to 0 indicates that the corresponding target page (page designated by the address field of the auxiliary page considered) is erased or is being erased.

The flags CS, COK and IS are provided to protect the memory against the consequences of an inopportune power interruption. The flag CS is set to 0 at the beginning of a writing step and the flag COK is set to 0 at the end of the writing step. The flag IS is set to 0 at the beginning of an invalidation step and the flag IOK is set to 0 at the end of the invalidation step. In an application where the supply voltage is not likely to be interrupted at an untimely moment, the flag IOK is sufficient to define the status of a page.

A page of the MA area or the XA area may thus have five different statuses according to the value of the control field:
"Erased" (i.e., "available") if CS/COK/IS/IOK=1111
"Data copy in progress" if CS/COK/IS/IOK=0111
"Valid" if CS/COK/IS/IOK=0011
"Invalidation in progress" if CS/COK/IS/IOK=0001
"Invalidated" if CS/COK/IS/IOK=0000

As a page is not invalidated as long as it has not been used at least once to write data, combinations of flag values of "1100" or "1101" type are not assumed to exist.

As an example, FIG. 2 shows an invalidated page P(i) in the MA area and a corresponding valid page, of same address <i>, in the XA area. In addition an erased target page, for example the page of address <8> in FIG. 2, only comprises bits at 1 in the data field DT thereof ("All 1") and only comprises control flags at 1, which means that it is available. Likewise, an erased auxiliary page only comprises bits at 1 ("All 1") in the address field AF and the data field DT thereof and only comprises control flags at 1, which also means that it is available and is not linked to any target page.

iv) "Rotating" Auxiliary Sectors

According to one embodiment, the XA area is divided into four sectors S1, S2, S3, S4 of a same size, each comprising N pages, as shown in FIGS. 1 and 2. Each sector can be addressed on the whole address field thereof, from 0 to N−1. Each sector S1 to S4 is successively given a particular status which is indicated by a field SID ("Sector identifier") here coded on two bits. The bits of the field SID of each sector are here saved in a service page SP, or "not useful" page (i.e., not used to store user data), for example the first page of each sector. This page is not included in the address field going from 0 to N−1 and is accessible by means of a particular wiring or a dedicated address (in FIGS. 2, 8A to 11F the field SID is shown in the continuation of the first page of each sector, to simplify figures).

The status successively allotted to each sector S1 to S4 are the following:
sector "UNA" ("UNAVAILABLE") or unavailable sector,
sector "CUR" ("CURRENT") or current sector,
sector "ERM" ("ERASE MAIN") or save sector, and
sector "CTM" ("COPY TO MAIN") or sector to be transferred.

As indicated in FIG. 4, the encoding of the field SID is for example the following:
sector having the status CTM: SID=00,
sector having the status ERM: SID=01,
sector having the status CUR: SID=11

The encoding of the status UNA is indifferent ("xx") because the successive allocation of each status to each sector is performed in loop in the order shown in FIG. 5, i.e.: UNA, CUR, ERM, CTM, etc., so that three successive sectors CUR, ERM, CTM always exist, the sector UNA being the contiguous sector following the sector CTM and preceding the sector CUR. Each sector S1, S2, S3, S4 thus switches from the status UNA to the status CUR, and then from the status CUR to the status ERM, then from the status ERM to the status CTM, then from the status CTM to the status UNA, and so forth. In the appended figures, except for FIG. 11F, it is considered for example that S1 is the sector UNA, S2 the sector CTM, S3 the sector ERM and S4 the sector CUR.

The sector having the status UNA, or "UNA sector", is a sector that is erased during an erasure step. This step comprises simultaneously erasing the auxiliary pages of the sector UNA and invalid target pages which addresses are memorizes in a map of addresses to be erased, or table EAM ("Erase Address Map"). Thus, at the same time, memory space is freed in the MA area and memory space is freed in the XA area. The sector UNA is unavailable to receive data and to supply data. It only comprises pages that have been previously invalidated before the status UNA was allotted thereto. Therefore, the addresses of the pages of the sector UNA are not in the map VAM. After complete erasure, the sector UNA is allotted the status CUR during a step called "Sector rotation"; it may be specified that the sectors S1 to S4 are immutable and that only the status that is allotted thereto is subject to the aforementioned rotation.

The sector having the status CUR, or "Sector CUR", is the only sector of the XA area used to write updated page data. Thus, when a target page in the MA area must be updated in the XA area, the landing page is always a page of the sector CUR. The sector CUR may also comprise a page to be updated (source page). In that case, the data of the source page, after updating in the page buffer PBUF, are written in another page of the same sector, then the source page is invalidated and the physical address thereof is replaced in the map VAM by the physical address of the other page. Globally, the valid pages of the sector CUR match target pages erased or to be erased, or invalidated target pages. When all the pages of the sector CUR have been used (i.e., written), the sector CUR is given the status ERM during the step of rotating the sectors.

The sector having the status ERM, or "ERM sector", has a double function. On the one hand, the address field thereof points toward target pages to be erased or being erased. These addresses are stored in the map EAM at the beginning of the erasure step (after the step of rotating the sectors) by reading all the addresses present in the address field of the valid pages of the sector ERM. Thus the map EAM only receives addresses of pages designated by valid pages of the sector ERM and which flag MER is not equal to 0 (the flag MER being provided to avoid pages that are already erased from being unnecessarily erased). In other words, the invalid pages of the sector ERM, as well as the valid pages which flag MER is equal to 0, are not taken into account to designate the pages of the MA area which must be erased. On the other hand, the sector ERM also has the function of saving data that the valid pages thereof comprise, while the corresponding pages in the MA area, toward which they point, are being erased. Eventually, although the sector ERM is unavailable to receive data, it may comprise a page to be updated (source page). In that case, the source page, after updating, is written in a page of the sector CUR, the source page in the sector ERM is invalidated and the address thereof is replaced in the map VAM by the physical address of the page in the sector CUR. When all the pages of the memory MA toward which the valid pages of the sector ERM points have been erased, the sector ERM is given the status CTM during the step of rotating the sectors.

The sector having the status CTM, or "sector CTM", comprises pages which are to be transferred to the MA area if these pages are valid. All the valid pages of the sector CTM point toward erased pages of the MA area, since the sector CTM previously had the status ERM. When a page has been transferred to the MA area, the page is invalidated and the address it contains is removed from the map VAM. The sector CTM is unavailable to receive data but may contain a page to be updated (page that has not been transferred to the MA area yet). In that case, the page data, after updating, are written in a page of the sector CUR, the source page in the sector CTM is invalidated and the address it contains is removed from the map VAM. The flag MER of the landing page is set to 0 to indicate that the corresponding page in the MA area is totally erased. The source page, after being invalidated, is not transferred to the MA area. When all the valid pages of the sector CTM have been transferred to the MA area, the sector CTM only comprises invalid pages and is given the status of sector UNA during the step of rotating the sectors.

In brief, the four-sector structure of the XA area allows three different operations to be managed:
- erasing auxiliary pages (pages of the sector UNA) and target pages (pages designated by the pages of the sector ERM),
- transferring valid auxiliary pages (pages of the sector CTM) to erased target pages, and
- updating pages of the MA area or the XA area (pages of the sector CUR, ERM or CTM) in pages of the sector CUR.

The step of erasing pages may conventionally comprise applying pulses of a high erase voltage (typically 10 to 15 V) to the memory cells concerned, while the memory cells of the pages of the MA area that must not be erased receive an erase inhibit voltage. As for the XA area, forming sectors on different substrates allows the sectors CTM, ERM, CUR to be isolated from the erase voltage applied to the sector UNA. Making the four sectors on a same substrate may however be provided, the sectors S1 to S4 then being logic sectors and not physical sectors.

v) Erasure in Several Steps

According to one embodiment, the erasure step is a step of partial erasure and several steps of partial erasure are performed to obtain the complete erasure of the sector UNA and the pages of the MA area designated by the sector ERM. In the frame of the present embodiment, the number of steps of partial erasure to obtain the complete erasure of memory cells is equal at the maximum to the number N of pages of the sector CUR, the optimum value being N steps of partial erasure.

Each step of partial erasure is a per se conventional step of erasure but the duration thereof is lower than that of a conventional step of erasure, and more particularly the duration thereof is equal to T/N where T is the average duration of a step of complete erasure. The step of partial erasure is thus applied during a duration T/N to the pages of the sector UNA and the pages of the MA area designated by the address field of the valid pages of the sector ERM which flag MER is not equal to 0. If erasing is performed by pulses (technique widely used to erase FLASH memories), the number of erase pulses applied to the memory cells during a step of partial erasure is equal to P/N where P is the average number of pulses of high erase voltage to obtain a complete erasure of the memory cells. The steps of partial erasure may be controlled like a conventional step of erasure and may comprise in that case a step of controlling the level of electric charges in the memory cells (consisting in reading the memory cells with an intermediary read voltage) in order to stop applying the erase pulses when it is no longer necessary. In that case, the last step of partial erasure may comprise less than P/N pulses if the control step shows that it is not necessary to further erase the memory cells.

vi) Write-Erase Cycle

One embodiment advantageously provides a method for writing data that gathers, in a so-called "write-erase" cycle, the aforementioned operations of partial erasure, transferring valid pages from the sector CTM to erased pages of the MA area, and writing updated data in the sector CUR. So as to simplify the implementation of this write-erase cycle, and as schematically shown in FIG. 4, an address pointer PT is used to designate, at each write-erase cycle:
- in the sector CTM, the page to be transferred to the MA area,
- in the sector CUR, the page to be used to write updated page data.

If the page designated by the pointer in the sector CTM is not valid, the copy is not performed and the write-erase cycle only comprises the step of partial erasure and the writing step. Thus, each time a piece of data is being written, two or three of the following steps are performed:
- pages of the MA area and pages of the XA area (pages of the sector UNA) are partially erased,
- a page located in the sector CTM is transferred "as is" (i.e., without updating) to the MA area (if this page is valid), and this page is invalidated,
- the content of a source page is transferred to the sector CUR, after being updated, and the source page is invalidated.

The pages of the MA area and the XA area are completely erased only after N cycles of partial erasure, i.e., after N pages of the sector CUR have been written, which then triggers the step of rotating sectors. After rotating the sectors, the old sector UNA completely erased is used as sector CUR. During a complete cycle of use of the sector CUR and until the following step of rotating the sectors, the pointer goes from 0 to N-1 and is incremented by one unit at each write-erase cycle. It is reset at each step of rotating the sectors.

This method of "pipe line" type offers several advantages. On the one hand, it allows new erased pages of the XA area to be permanently made available to write updated page data. On the other hand, it reduces by a factor N the apparent duration for erasing the pages, since the step of partial erasure applied to the pages concerned between two data writing is of a duration N times lower than the duration of a step of complete erasure. Eventually, the step of "continuous" partial erasure does not require the reception of write commands to be interrupted. If the time for writing the memory cells is for example of 5 microseconds, and the erase time of 100 milliseconds, the apparent erase time is of 1 millisecond if N=100, each sector of the XA area then comprising 100 pages.

B—Embodiment of the Memory

In the memory schematically shown in FIG. 1, the map EAM, the map VAM, the address pointer PT and the page buffer PBUF are controlled by a microprocessor or wired-logic control unit CU (state machine). The writing method is implemented in the form of an algorithm executed by the unit CU.

Figure 6:
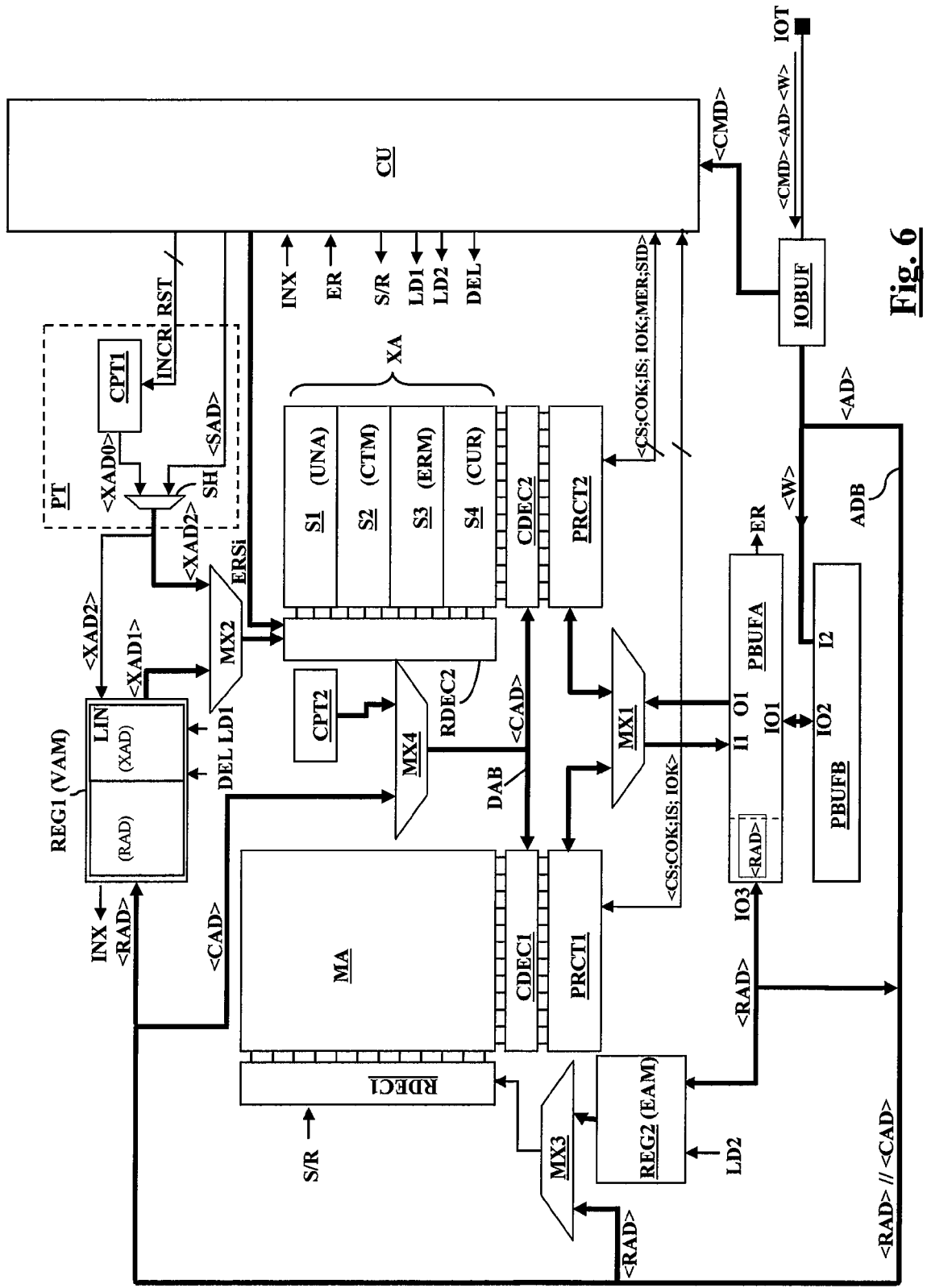
FIG. 6 shows in further details an example architecture of memory in accordance with the diagram of FIG. 1, FIGS. 7A, 7B are organigrams showing steps of one embodiment of a method according to the invention.

FIG. 6 shows a detailed embodiment of the diagram of FIG. 1. In addition to the elements shown in FIG. 1, the memory comprises elements described hereinafter.

i) Input/Output and Address Bus

The memory comprises an input/output buffer IOBUF linked to an input/output terminal IOT. This buffer allows the memory to receive read or write commands CMD coming with word addresses AD, the write commands also coming with one or more words W to be written. The word address AD comprises a row address RAD (most significant address bits) and a column address CAD (least significant address bits). The row address RAD is the address of a target page in the MA area and the column address CAD is the address of the segment where the word is located in the target page or in the corresponding source page. An address bus ADB carries addresses of pages RAD which are read in auxiliary pages or come with commands, as well as column addresses CAD which come with commands.

ii) Decoders and Read and Write Circuits

A row decoder RDEC1 allows pages to be selected in the MA area in reading, writing or erasing, and a column decoder CDEC1 allows words to be read or written to be selected in pages selected in the MA area. A circuit PRCT1 performs writing and reading the MA area and comprises sense amplifiers and programming locks (not shown) to read or write a word selected in a page. A row decoder RDEC2 allows pages to be selected in the XA area in reading or writing, and a column decoder CDEC2 allows words to be read or written to be selected in pages selected in the XA area. Likewise, a circuit PRCT2 performs writing and reading the XA area and comprises sense amplifiers and programming locks to read or write at least one word or the address field of a selected page.

The circuits PRCT1, PRCT2 are configured to allow the control unit CU to read or write the flags CS, COK, IS, IOK (pages of the MA or XA area), MER (pages of the XA area) as well as the field SID (service pages of the XA area). In read mode, the flags are automatically read by additional sense amplifiers provided to that end and are sent to the control unit. In write mode, specific programming locks allow the control unit to individually modify the value of each flag.

The decoder RDEC2 comprises four decoding stages SS1, SS2, SS3, SS4 and receives, through a multiplexer MX2, an address of page XAD1 supplied by the map VAM or an address of page XAD2 supplied by the pointer PT, these addresses being good for reading and writing only. In erase mode, the pages of the sector to be erased (sector UNA) are selected by the decoder RDEC2 upon reception of a signal ERSi which may have four values ESR1, ESR2, ESR3, ERS4, i.e., one value per sector to be selected in erasing. Applying the signal ERSi inhibits the selection of the pages using the addresses XAD1 or XAD2.

ii) Pointer PT

The pointer PT comprises a counter CPT1 of volatile type and a circuit SH for concatenating most significant address bits and least significant address bits, also forming an output buffer of the pointer PT. More particularly, the address XAD2 supplied by the pointer PT is the result of concatenating an address XAD0 supplied by the counter CPT1 and a most significant address, forming a sector address SAD, supplied by the control unit CU, both addresses being applied to the circuit SH. The address XAD0 is thus an address of page within the selected sector and goes from 0 to N−1. Thus, with the same address XAD0 supplied by the counter CPT1, the control unit may select pages of a same least significant address in the sectors CTM and CUR, by only changing the sector address SAD.

After a step of rotating the sectors, the control unit switches the counter CPT1 to 0 so that the pointer supplies the address of the first current page of the sector CTM to be transferred to the MA area (if this page is valid) or the address of the first current erased page of the sector CUR that must receive updated data, according to the sector address SAD which is applied thereto. The control unit then increments the counter using a signal INCR, at each following write-erase cycle.

After a step of rotating the sectors and before the beginning of the first write-erase cycle, the pointer PT is also used by the control unit to load in the map EAM the addresses of pages to be erased in the MA area. To that end the counter CPT1 is switched to 0 and the sector ERM is selected in reading. The address field of the pages of the sector are read and transferred to the map EAM. The control fields of the pages being automatically read by the circuit PRCT2, the control unit only loads into the map EAM the addresses read in valid pages and which flag MER is not equal to 0.

iv) Map VAM

The map VAM is managed in a volatile register REG1 which comprises a pointing input linked to the address bus ADB to receive the address RAD present on the bus, and an output linked to the decoder RDEC2 via the multiplexer MX2. The register REG1 comprises a list of prestored addresses RAD and, in front of this list, a list of addresses XAD which is initially empty, the whole forming the map VAM. An address RAD of the map matches a location to receive an address XAD. When an address RAD is on the bus and is seen by the pointing input, the register automatically sets on this address in the map and supplies the corresponding address XAD (referred to as XAD1 in FIG. 6) if the location is not empty. The register then switches a signal INX to 1 which indicates to the control unit that a valid address page RAD is in the XA area. If the location in front of the address RAD is empty in the map VAM, the signal INX remains at 0. This signal thus allows the control unit to know which read circuit PRCT1, PRCT2 it may activate.

The register REG1 further comprises a load input LIN which receives the address XAD2 supplied by the pointer PT. When the control unit wants to associate a determined address XAD2 supplied by the pointer PT to a determined address RAD present on the bus ADB, the control unit applies a load signal LD1 to the register REG1 and the address present at the input LIN is saved in the map VAM, in front of the address RAD selected by the pointing input. Conversely, when the control unit wants to delete an address XAD from the map VAM, it applies a delete signal DEL to the register.

v) Page Buffer PBUF

The page buffer here comprises two buffers PBUFA, PBUFB, updating the pages being performed by the buffer PBUFB. The buffer PBUFA comprises an input I1 linked to outputs of circuits PRCT1, PRCT2 via a multiplexer MX1, to receive a word read in one of the areas MA, XA, or an entire page read word by word, as well as the address field of an auxiliary page. The buffer PBUFA sends a signal ER when a word loaded into the buffer has all the bits thereof equal to 1 (erased word). This signal is also switched to 1 when all the words of a page have been loaded into the buffer PBUFA and that the page only comprises bits at 1 (erased page). The signal ER is for example the result of the AND function of all the bits present in the buffer PBUFA, these bits being switched to 1 by default after resetting the buffer.

The buffer PBUFA further comprises an output O1 linked to inputs of the circuits PRCT1, PRCT2 via the multiplexer MX1, to load into the circuits PRCT1, PRCT2 a word to be written in the areas MA, XA, or load in the circuit PRCT2 an address field to be written in the XA area. It further comprises an input/output IO2 linked to an input/output I/O of the buffer PBUFB, to transfer the content thereof to the second buffer or receive the content of the second buffer. The buffer PBUFA further comprises an input/output IO3 linked to the map VAM and the address bus ADB, to supply addresses RAD read in address fields of auxiliary pages or conversely load into the buffer an address present on the bus and which must be written in the address field of an auxiliary page.

The buffer PBUFB comprises a second input I2 linked to the buffer IOBUF to receive one or more words W to be written in the memory. The buffer PBUFB updates the content of a page supplied by the buffer PBUFA by inserting thereto the word(s) supplied by the buffer IOBUF, the input/output IO2 thereof allowing the updated page data to be put back in the buffer PBUFA.

vi) Map EAM

The map EAM is managed by a volatile register REG2 having an input linked to the input/output IO3 of the buffer PBUFA, to receive addresses of pages to be erased read in the sector ERM, in response to a load signal LD2 sent by the control unit. An output of the register REG2 is applied to an address input of the decoder RDEC1 through a multiplexer MX3 which other input is linked to the address bus. In read mode, the control unit uses the multiplexer MX3 to apply to the decoder RDEC1 the address RAD present on the bus. In erase mode, the control unit links the output of the register REG2 to the decoder RDEC1.

The decoder RDEC1 comprises word line locks (not shown) to select pages which addresses are in the map EAM. To that end, the register REG2 is read address by address. For each address read, the control unit applies to the decoder RDEC1 a signal S/R (Set/Reset) to lock the selection of the corresponding page. Once all the pages designated by the map EAM are selected, the erase voltage may be collectively applied thereto, the pages not selected receiving an erase inhibit voltage.

vii) Scanning Addresses of Word within a Selected Page

The column address CAD supplied by the buffer IOBUF is applied to the decoders CDEC1, CDEC2 through a multiplexer MX4 which other input is linked to the output of an address counter CPT2. When a word of address CAD must be read or written in a selected page, the control unit applies the address CAD to the decoders CDEC1, CDEC2 and activates one of the decoders. When an entire page must be read, the control unit links the output of the counter CPT2 to the decoders CDEC1, CDEC2, switches the counter to 0 and scans the entire column address field to read the words one after another, the result of the reading being loaded into the buffer PBUFA.

C—Memory Reset

Figures 7A, 7B:
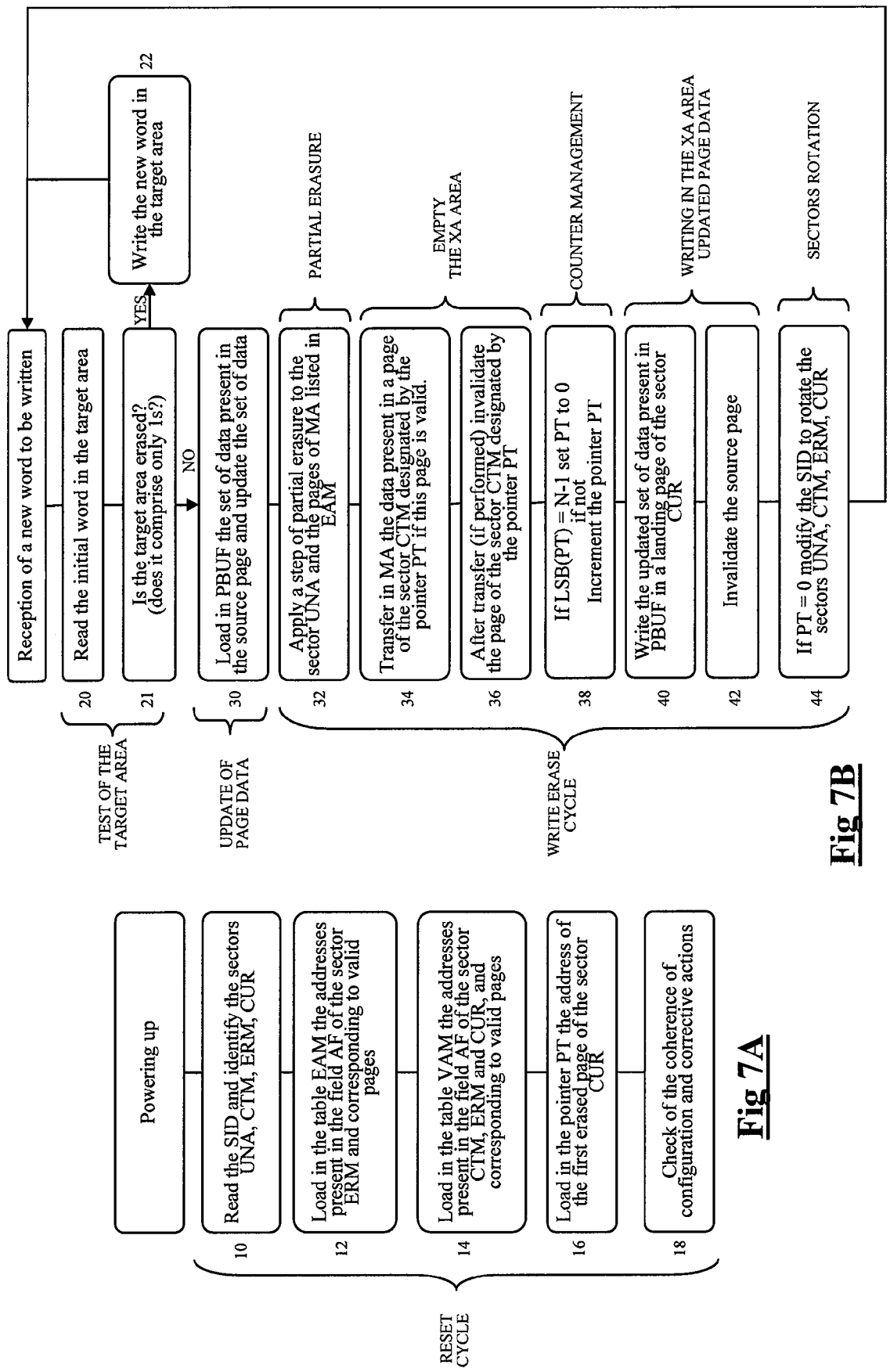

The diagram in FIG. 7A describes a cycle for resetting the memory after the powering up thereof, which follows a voluntary or accidental power interruption. The maps VAM and EAM, as well as the pointer PT being volatile data, the content thereof is regenerated by the control unit from the information located in the MA and XA areas. The following steps may be distinguished.

i) Identifying the Sectors (Step 10)

The control unit reads the fields SID in the service pages and identifies the sectors UNA, CTM, ERM, CUR. As indicated above the sector UNA is identified by default as being the fourth sector following the sectors successively having SID equal to 11, 01 and 00 (Cf. FIG. 5).

ii) Updating the Map EAM (Step 12)

This step is identical to that performed after rotating the sectors. The address fields are read in the sector ERM and are loaded into the register REG2 via the buffer PBUFA, if they belong to valid pages and if the flag MER of these pages is not 0. After a power interruption, a complete erase cycle is applied by security to the pages designated by the sector ERM.

iii) Updating the Map VAM (Step 14)

The map VAM is regenerated by reading in the sectors CTM, ERM and CUR the valid pages and simultaneously saving in the register REG1 the physical addresses XAD of these pages. So that the register REG1 points toward the good address RAD when an address XAD is saved in the right part of the map VAM (Cf. FIG. 6), the address read in the address field of each valid page is applied to the address bus ADB via the buffer (Cf. FIG. 6) and thus lands at the input of the register REG1. It may be noted that these addresses match, in the MA area, erased or invalidated pages. More particularly:

the valid pages of the sector CUR match erased or invalidated pages of the MA area, the valid pages of the sector CTM match already erased pages of the MA area, the valid pages of the sector ERM which flag ER is not at 0 match pages of the MA area which were being erased at the time of the power interruption.

vi) Updating the Pointer PT (Step 16)

The control unit may here find the first erased page of the sector CUR. So as to find this first page after a power interruption, the counter CPT1 is reset by means of the signal RST and the sector CUR is read page by page incrementing the counter until an erased page is found. The least significant address of this page is then let in the counter CPT1 to generate the address XAD2 supplied by the pointer PT. It is to be noted that a page of the sector CUR is assumed not to be in the erased state as soon as the flag CS is equal to 0 and even if the flag COK is at 1. That means indeed that the page began to be written before the power interruption.

v) Controlling Coherence (Step 18)

The memory is protected against accidental power interruptions thanks to the redundancy of flags CS/COK and IS/IOK that makes it possible to trace step by step, steps of intermediary process like the beginning of a page writing and the end of the page writing, or the beginning of a page invalidation and the end of the page invalidation, so that at powering up the process unit may identify without ambiguity valid pages and invalid pages, uncompleted processes and possible conflicts. Controlling coherence is based on an analysis of the incoherence between flags. For example, if a page was being written at the time of the power interruption, the page has the flag CS at 0 but the flag COK is at 1. Thus, the data of the page are not good and the control unit searches for the invalid page of same (physical or virtual) address in order to find the old data of the page, so that only updating has been lost. Various steps of controlling coherence and corresponding corrective actions may be provided and will not be described here for simplicity reasons.

D—Writing a Piece of Data in the Memory

FIG. 7B is a flowchart showing a writing method according to one embodiment, in response to a command for writing a word W in a page P(i) of address <i>.

The method comprises a step of testing the target area (segment of the source page that may receive the word), a step of updating page data, and then the write-erase cycle.

i) Testing the Target Area

Testing the target area is provided to avoid the write-erase cycle from beginning if the target area is in the erased state, which may be the case when the target page is completely erased or when data have been written in other segments of the target page but not in the target area itself.

The content of the target area is read at the address indicated by the command (Step 20). The target area may be located in the MA area (the source page is the target page) or in the XA area (the source page is different of the target page). Selecting the adapted area MA or XA is automatically performed by the map VAM and the signal INX indicates to the control unit which read circuit it may activate. The control unit then considers the signal ER supplied by the buffer PBUFA (Step 21). If the signal is equal to 1, the control unit writes the word in the target area (Step 22) and returns to a step of waiting for a new command. If the signal ER is equal to 0, it means that the target area is not erased and may not be written. The control unit then switches to the step of updating page data, described below.

ii) Updating Page Data

All the words contained in the source page are loaded into the buffer PBUFA, using the counter CPT2 to perform scanning the column addresses CAD. The address of the target page present on the address bus is also loaded into the buffer PBUFA. The buffer thus comprises a set of initial data and the address of the target page. The content of the buffer PBUFA is transferred to the buffer PBUFB. The latter integrates therein the word to be written and overwrites the initial word (Step 30) without modifying the other words of the page.

iv) Write-Erase Cycle

The write-erase cycle comprises the three steps described above, and steps of managing the pointer PT.

Step 32: The control unit applies a step of partial erasure to the sector UNA and the pages of the MA area listed in the map EAM, after transferring to the decoder RDECE1 the addresses present in the map EAM and locking the selection of the corresponding pages.

Step 34: The control unit may transfer to the MA area the data present in a page of the sector CTM designated by the pointer PT. To that end, the control unit applies to the pointer PT a sector address SAD corresponding to the sector CTM and first analyses the control field of the page to determine if it is valid.

If the page is not valid, no transfer is performed. If the page is not valid but does not only comprise data equal to 0 (old source page which has not been switched to 0 to keep the address field thereof, see Step 42), the control unit switches all the page data to 0, included the flags and the address field. This reset of the data of the invalid page is optional and is only provided in relation with the management of electric charge levels in some types of memory cells, so that the erase process is applied to memory cells in the same electric state. If the page is not valid and only contains data equal to 0, the control unit does not have any operation to perform in this page.

If the page is valid, the page is read by means of the circuit PRCT2 and is copied out in the buffer PBUFA (the updated page data being kept in the buffer PBUFB in the meanwhile). The address field present in the page is applied to the row decoder RDEC1 via the buffer PBUFA, the address bus and the multiplexer MX3. The content of the buffer PBUFA is then transferred to the circuit PRCT1 and is written in the concerned page of the MA area. The flag CS of the page is switched to 0 before writing the words and the flag COK is switched to 0 after writing the words.

Step 36: After the transferring thereof in the MA area, the page of the sector CTM designated by the pointer PT is invalidated and the physical address thereof is removed from the map VAM. To that end the flag IS of the page is switched to 0, then all the data of the page of the sector CTM are switched to 0 (management of electric charge levels) except for the flags IOK and MER, which are switched to 0 lastly. Here too, the reset is optional and is only provided in relation with the management of electric charge levels.

Step 38: This step aims at incrementing the pointer PT. The control unit previously determines if the address XAD0 supplied by the counter CPT1, which represents the least significant bits LSB(PT) of the address supplied by the pointer, is equal to N−1, i.e., the maximum value of the address field in each sector. If the maximum address N−1 is reached the control unit resets the counter CPT1 or increments it by one unit by means of the signal INCR. The incremented value of the counter remains a value internal to the counter and is not unlocked by the buffer SH.

Step 40: The updated page data, present in the buffer PBUFB, are transferred to the buffer PBUFA. The sector address SAD applied to the pointer is modified by the control unit to address the sector CUR. Thus the pointer PT now supplies the address of an erased page in the sector CUR (having the same least significant address as the sector CTM subject of the Steps 34 and 36). In addition the address RAD of the target page is placed once again on the bus ADB, via the input/output IO3 of the buffer PBUFA. The content of the buffer PBUFA is transferred to the circuit PRCT2 and is written in the selected page. As previously the flag CS of the page is previously switched to 0 and the flag COK is switched to after writing the page. The flag MER is also switched to zero if the source page which data have been loaded into the page buffer (Step 30) belongs to the sector CTM or the sector ERM, since the pages of the sector CTM are linked to erased target pages and the pages of the sector ERM are linked to target pages being erased.

Step 42: The source page is selected once again to be invalidated, the output of the map VAM (address XAD1) being applied to the decoder RDEC2 via the multiplexer MX2. The flag IS of the page is switched to 0, then all the data of the page of the sector CTM are switched to 0 (management of electric charge levels) except for the flags IOK and MER, which are switched to 0 lastly. If the source page belongs to the sector ERM, only the flag IS is switched to 0. Indeed the page contains the address of a page of the sector MA being erased. This address may not be erased as long as the erase step is not completed, because it is necessary to regenerate the map EAM after a power interruption. If the source page is not the target page, the address XAD of the source page is removed from the map VAM (signal DEL). The address of the new source page, supplied by the pointer PT (address XAD1) is saved in the map VAM by means of the signal LD1 applied to the register REG1.

Step 44: During this step, the sector identifiers SID are modified by the control unit to rotate the sectors, if the pointer has been switched to 0 during the Step 38.

After Step 44, the control unit returns to the initial state of waiting a new command.

E—Examples of Write-erase Cycles

The method will be better understood to the light of some examples of write-erase cycles according to various embodiments. It is assumed in each example hereinafter that the memory receives a command for writing a word W and that the target area is not in the erased state, so that the write-erase cycle is triggered.

EXAMPLE 1

FIG. 8A to 8H show the case where the source page of the write-erase cycle is the target page of the write command (which means that the source page is in the MA area).

Figure 8A:
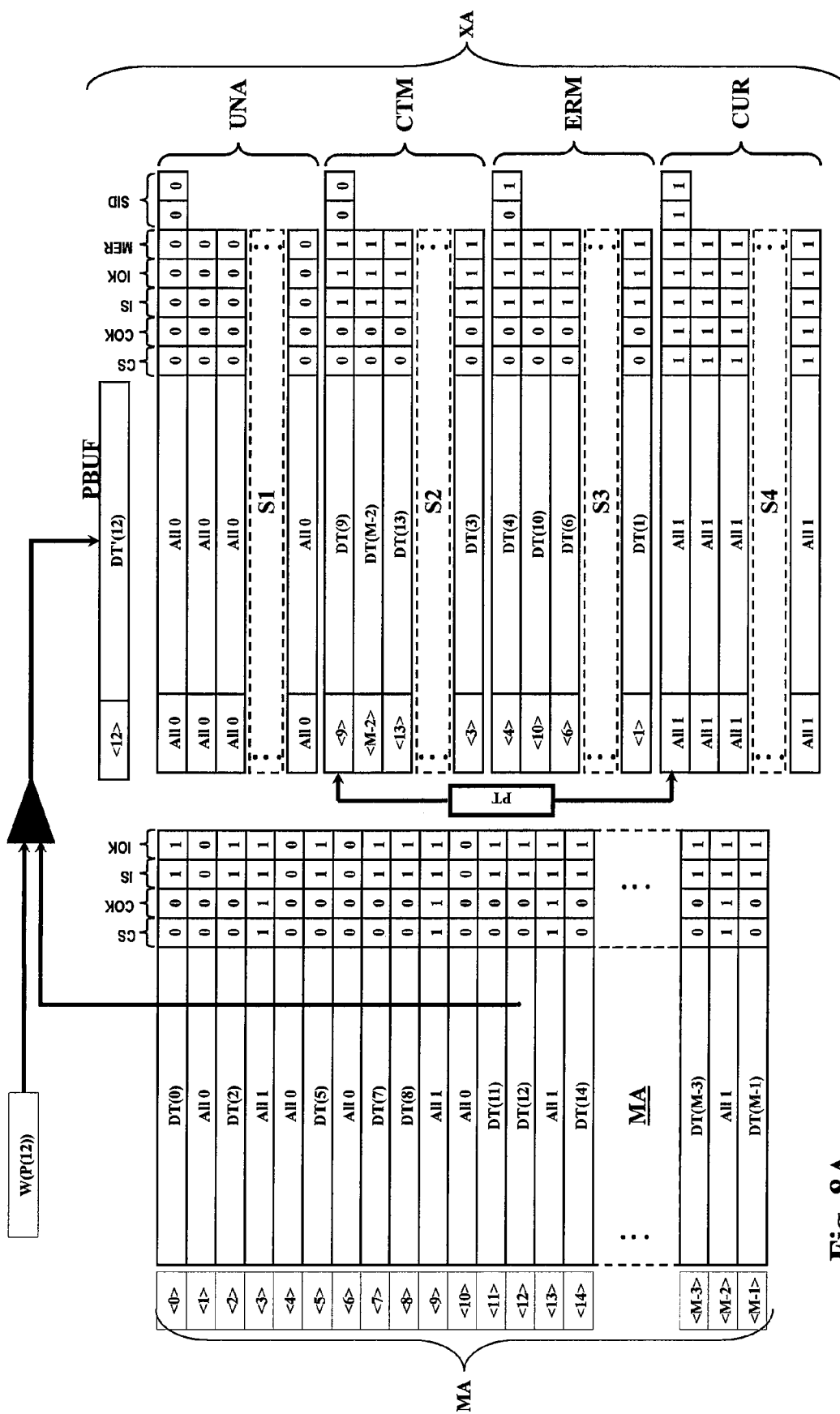
FIGS. 8A to 8H show a write-erase cycle, with a source page in the main memory area.

FIG. 8A: The memory receives a command for writing a word W aiming at the target page P(12). The target page is not invalid (IS=IOK=1) and is thus used as source page. The content thereof DT(12) is copied out in the page buffer PBUF (PBUFA, PBUFB). The new word W is inserted therein to obtain updated page data DT'(12).

Figure 8B:
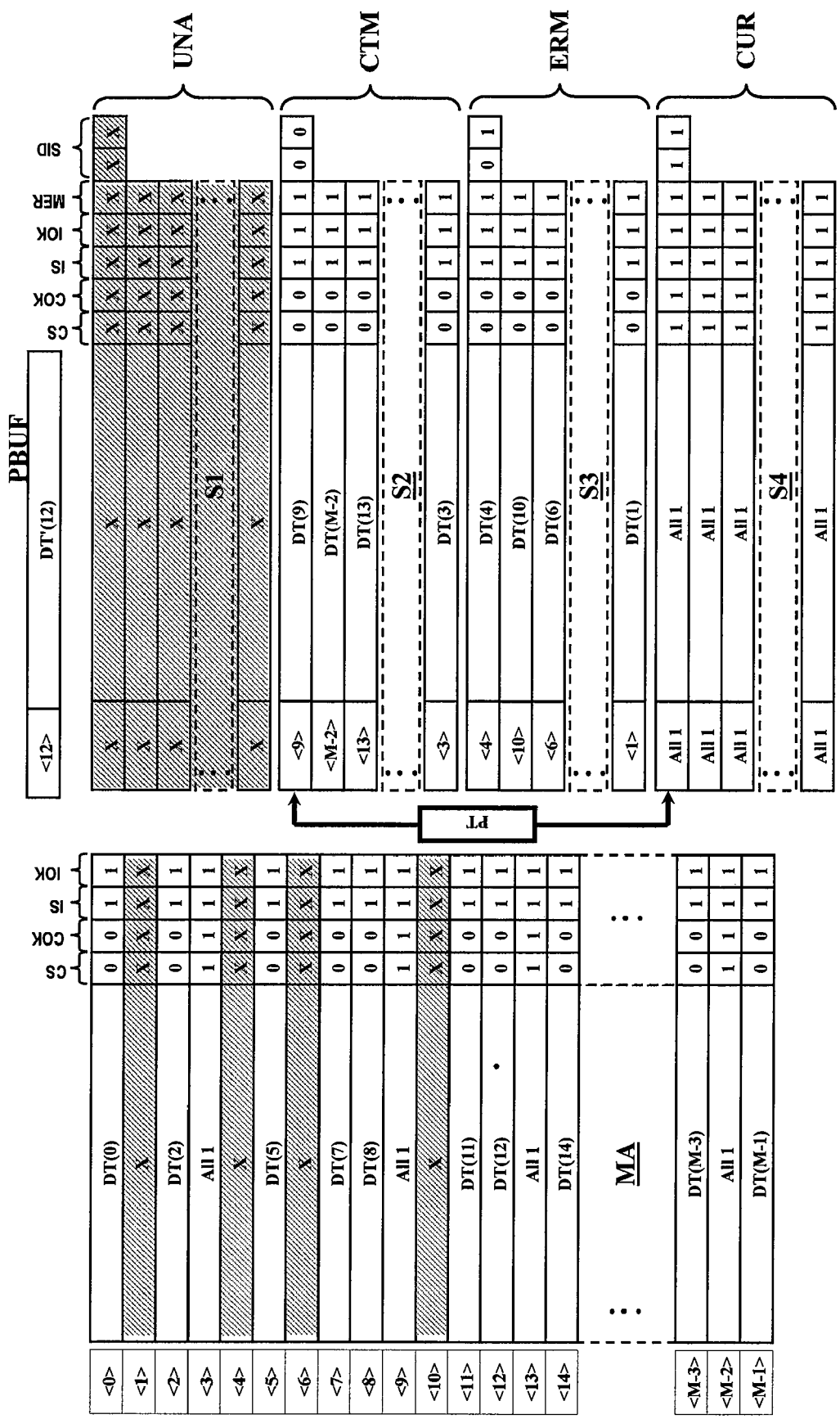

FIG. 8B: A step of partial erasure is applied to the pages of the sector UNA as well as pages of the MA area which addresses <1>, <4>, <6>, <10> are present in the address fields of valid pages of the sector ERM which flag MER is not equal to 0, and have been previously copied out in the map EAM. It is the first step of partial erasure after rotating the sectors and the pointer PT is positioned on the first page of the sector CTM or the first page of the sector CUR (according to the sector address SAD which is applied thereto), which means that the least significant address XAD0 is equal to 0 in the counter CPT1 (FIG. 6). Before the beginning of the step of partial erasure, the pages of addresses <1>, <4>, <6>, <10> comprise data which all are at 0 (All 0, FIG. 8A) and flags which are also equal to 0, because these pages have been previously invalidated. These data and flags are in an undetermined state "x" after the step of partial erasure, the undetermined state corresponding to an allocation of electric charges in the memory cells that does neither correspond to logic "0" nor to logic "1", the logic "1" or erase logic value may be only reached after N steps of partial erasure.

Figure 8C:
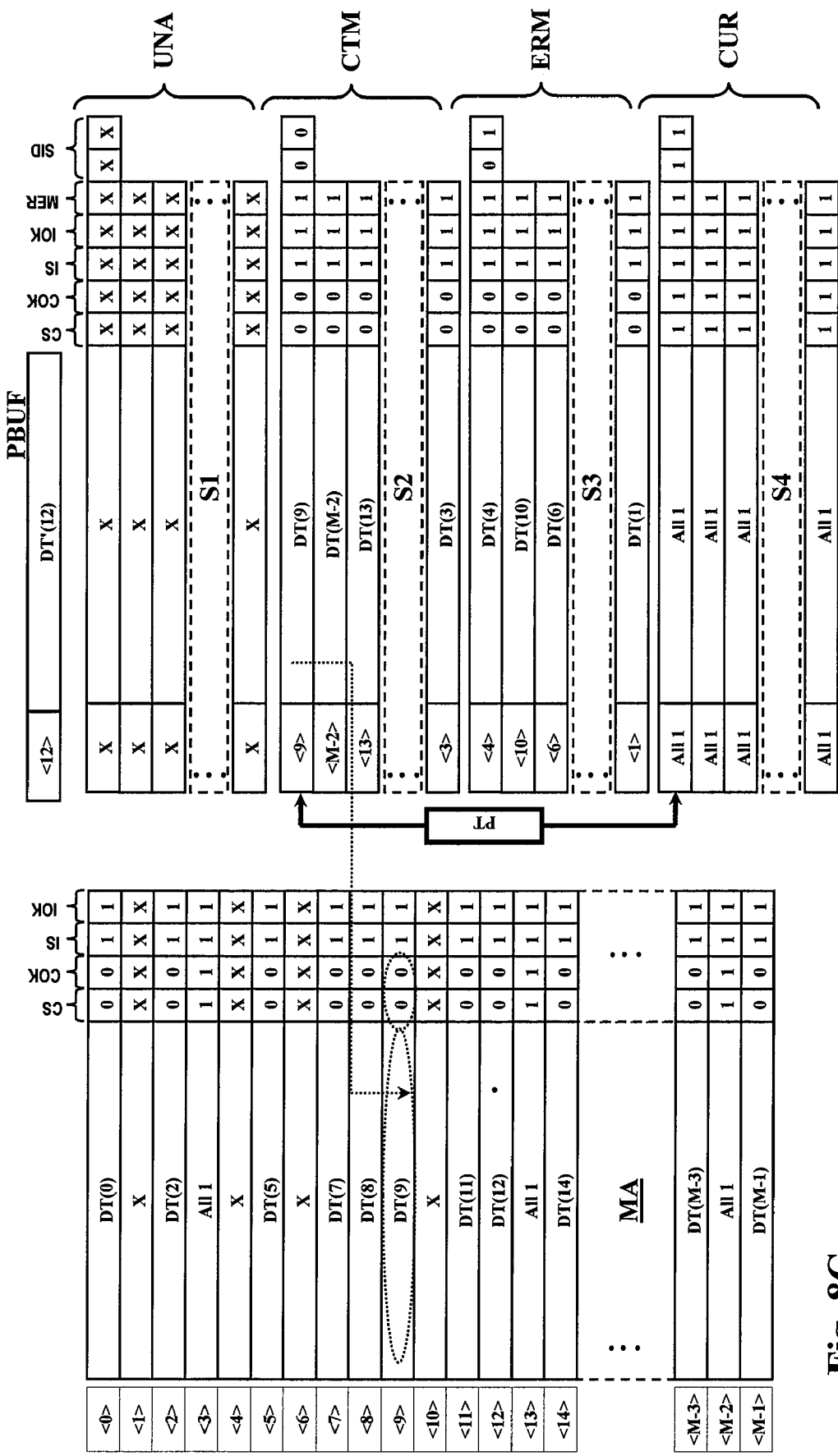

FIG. 8C: The address of the sector CTM (most significant address SAD) is applied to the pointer PT, the output buffer SH (FIG. 6) is unlocked and the pointer designates the first page of the sector CTM. The first page of the sector CTM is valid (IS=IOK=1). The address field of this page comprises the address <9> (virtual address of the page). The data of this page are thus transferred to the page of physical address <9> of the MA area. The copy step comprises previously switching to 0 the flag CS of the page of physical address <9>, then copying out words of the page of virtual address <9> into the page of physical address <9>, and switching the flag COK of the page of physical address <9> to 0.

Figure 8D:
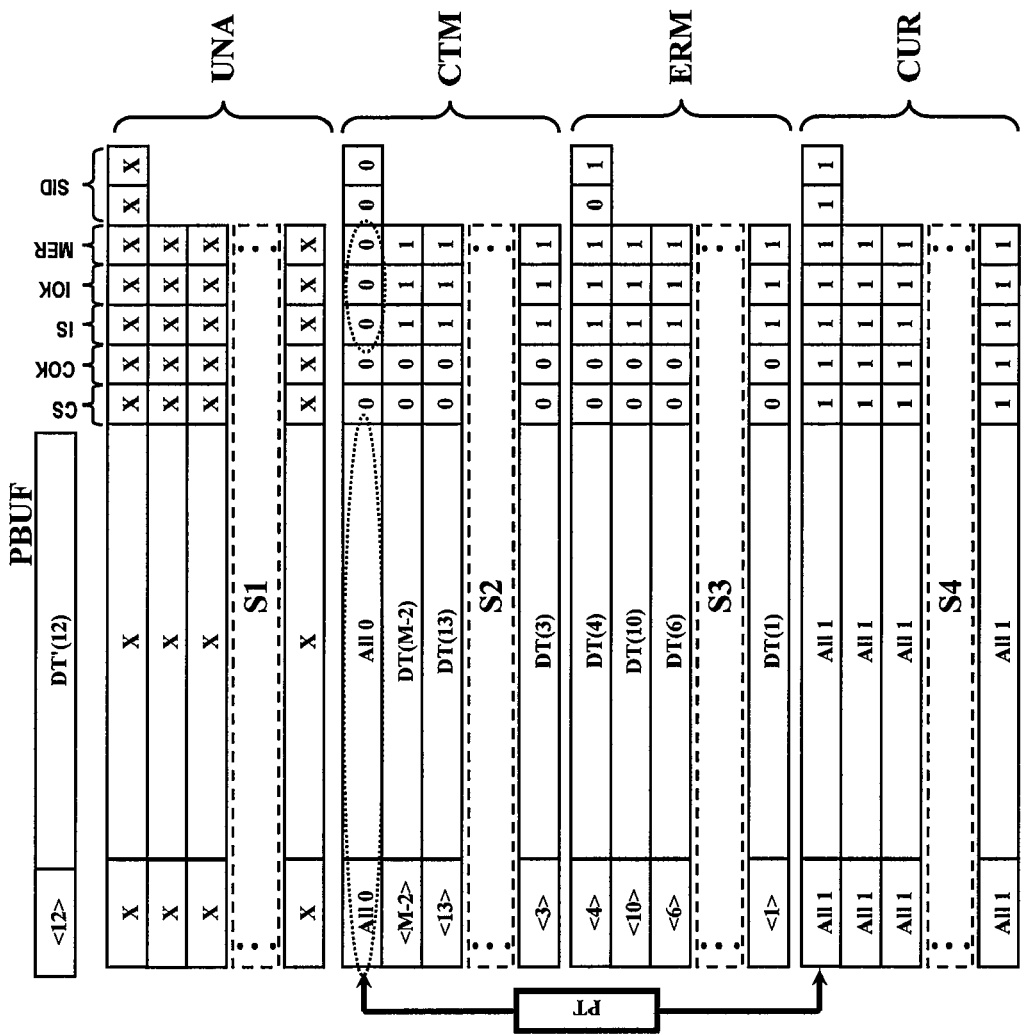
Figure 8D:
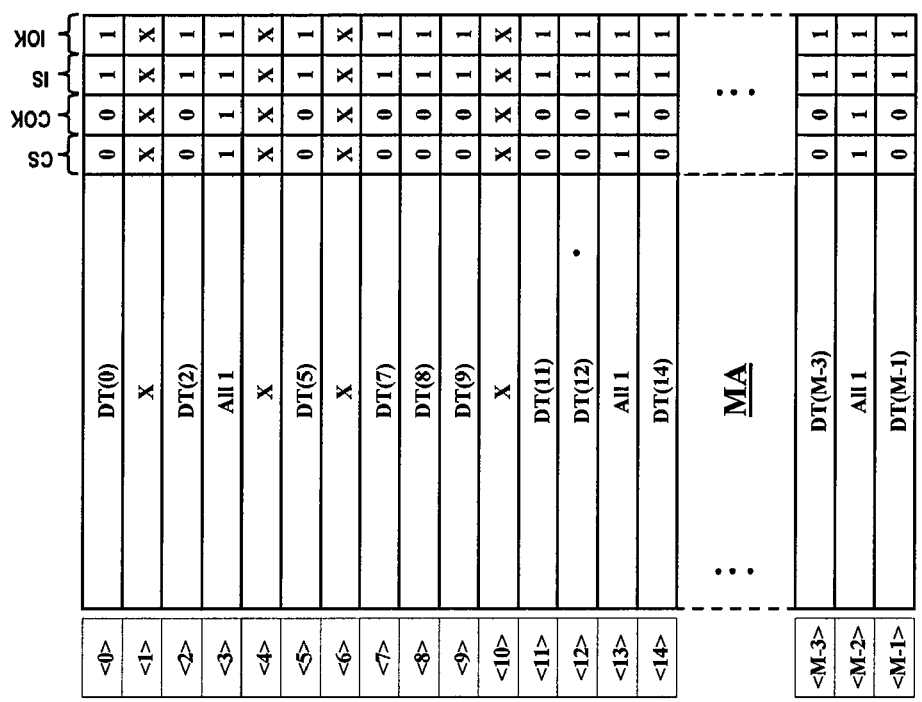

FIG. 8D: The page of virtual address <9> of the sector CTM is invalidated by successively switching to 0 the flag IS, then the data and address fields of the page, and the flags IOK and MER. The physical address of this page is removed from the map VAM.

Figure 8E:
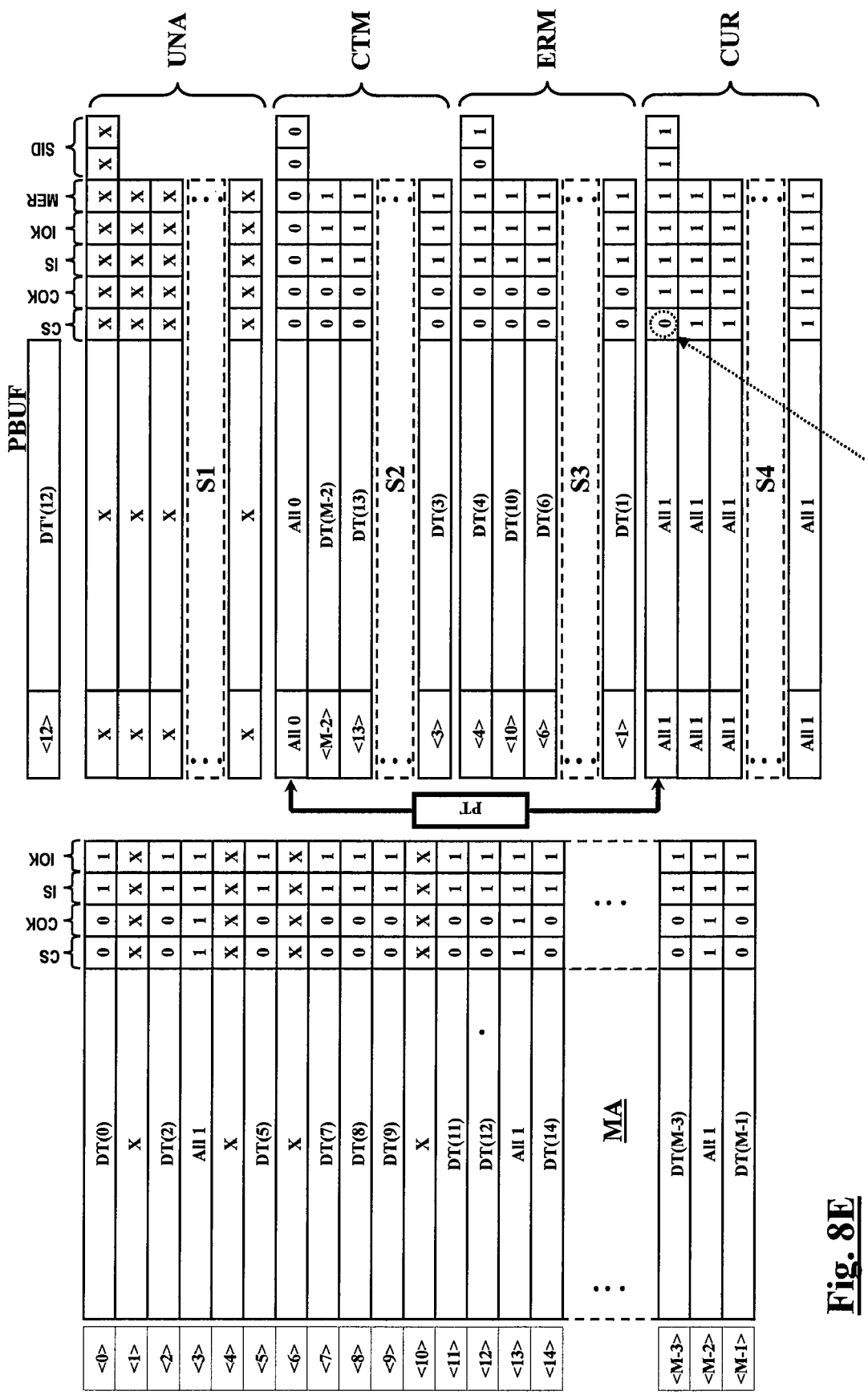

FIG. 8E: The control unit applies to the pointer PT the address of the sector CUR, the output buffer SH is unlocked and the pointer now designates the erased page of the sector CUR that may receive the updated page data, here the first page of the sector CUR. The flag CS of the page is switched to 0.

Figure 8F:
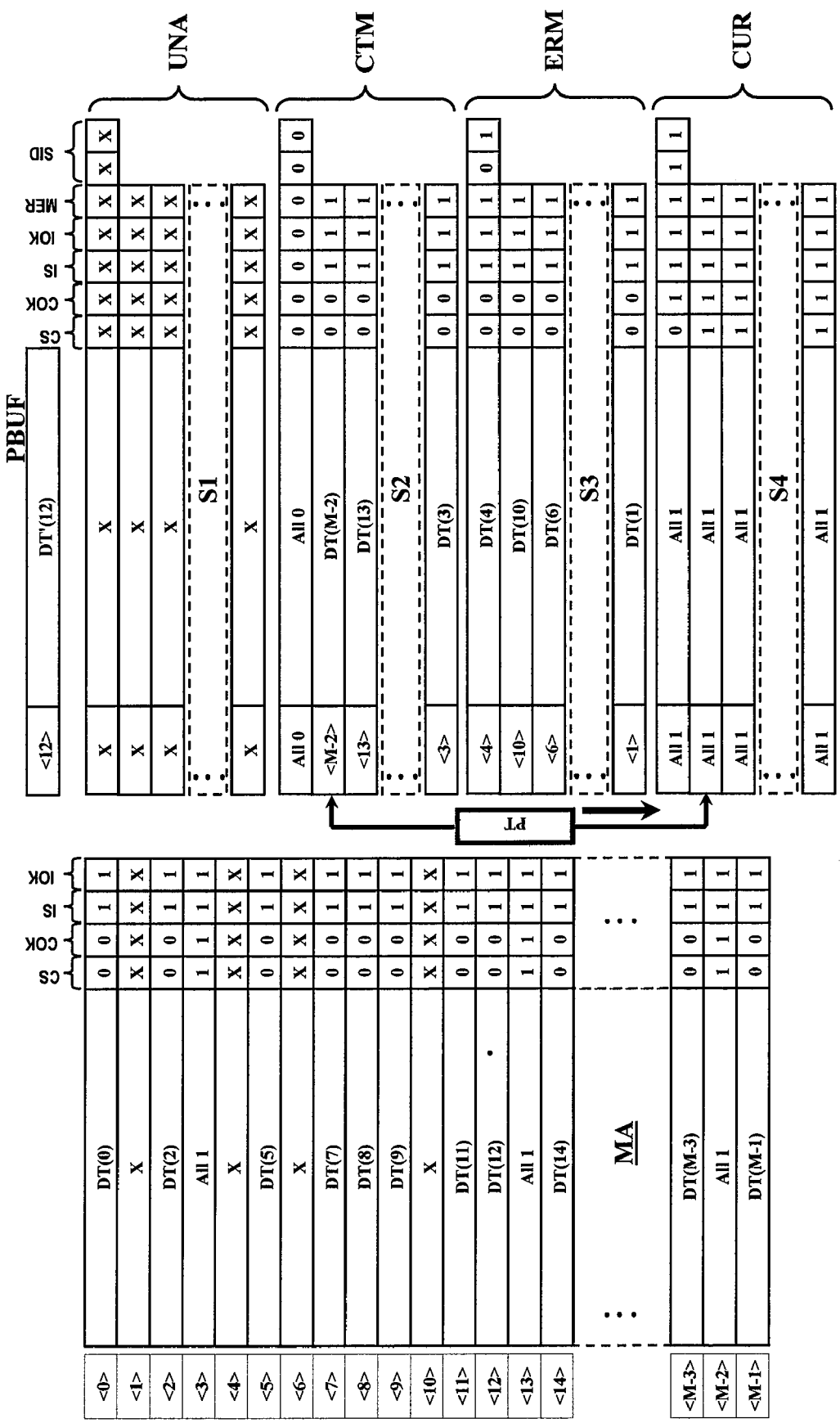

FIG. 8F: The pointer PT is incremented by applying the signal INCR to the counter CPT1 (FIG. 6) but the new pointer address remains blocked by the buffer SH. The pointer is thus positioned on the following address but this address is not validated at the input of the decoder RDEC2 and the register REG1 of the map VAM.

Figure 8G:
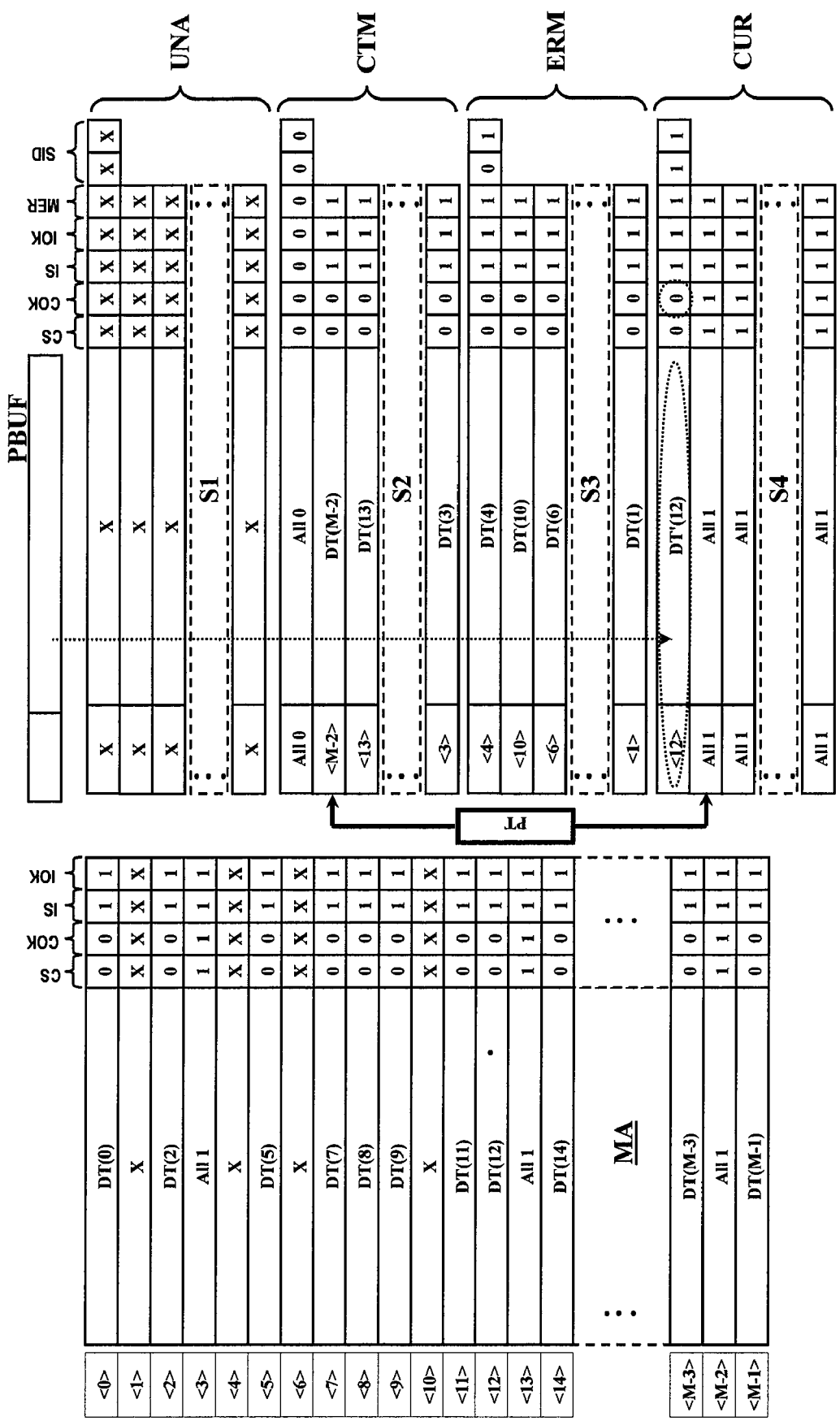

FIG. 8G: The updated page data DT'(12) present in the buffer PBUF, as well as the address <12> of the target page are written in the erased page of the sector CUR (the pointer going on supplying the address of this page). Writing is performed in the following order: Writing the data and address field <12> and switching the flag COK to 0. This page therefore becomes a source page of virtual address <12> but may only be saved in the map VAM after invalidating the source page.

Figure 8H:
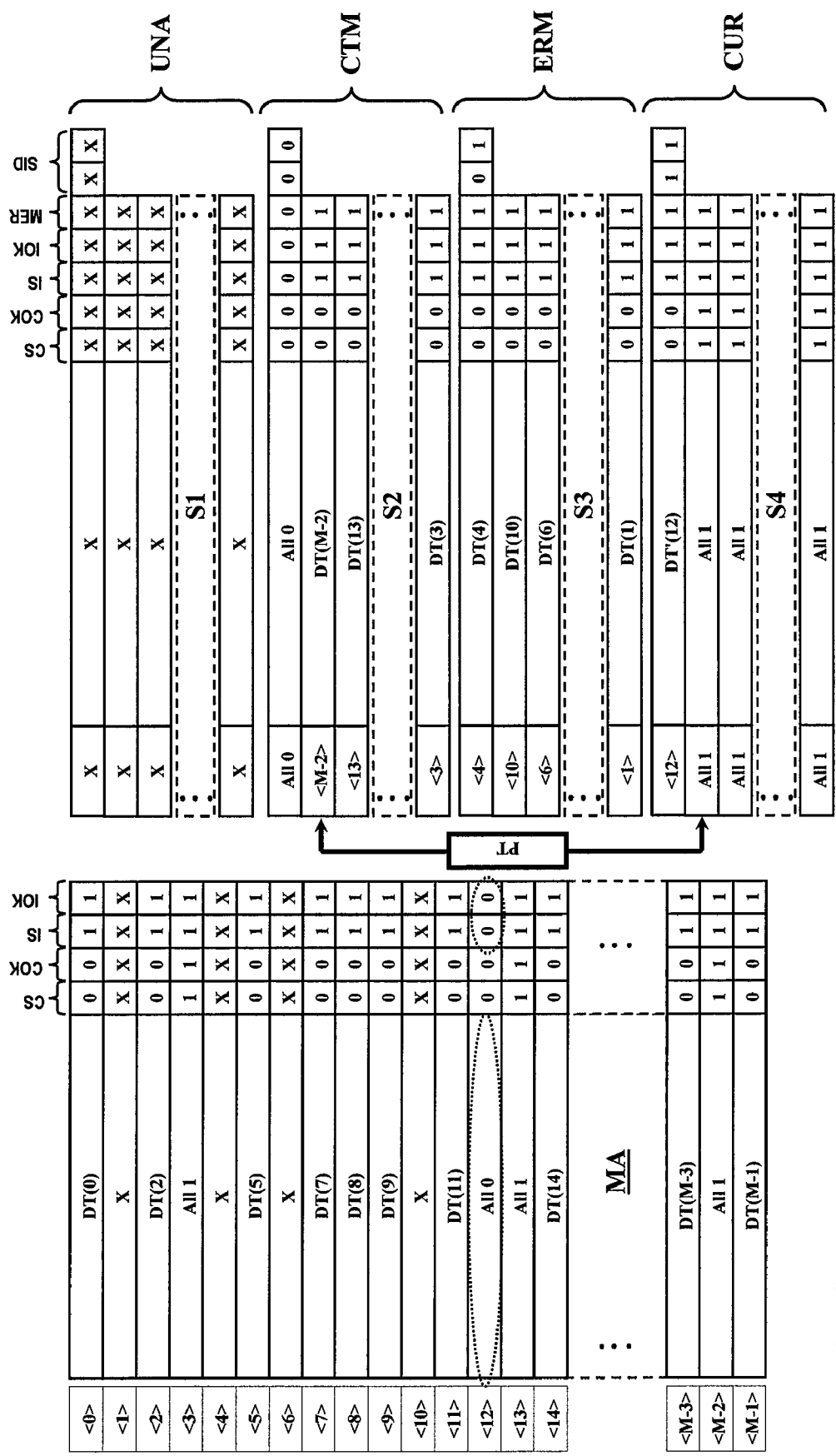

FIG. 8H: The source page of address <12> which is also here the target page, is invalidated: switching the bit IS to 0, switching all page data to 0, switching the bit IOK to 0. The physical address of the page of virtual address <12>, supplied by the pointer PT is then saved in the map VAM.

EXAMPLE 2

FIGS. 9A to 9H show the write-erase cycle in the case where the source page is in the sector CTM, which means that the data of the corresponding target page have already been transferred to the source page during a previous update.

Figure 9A:
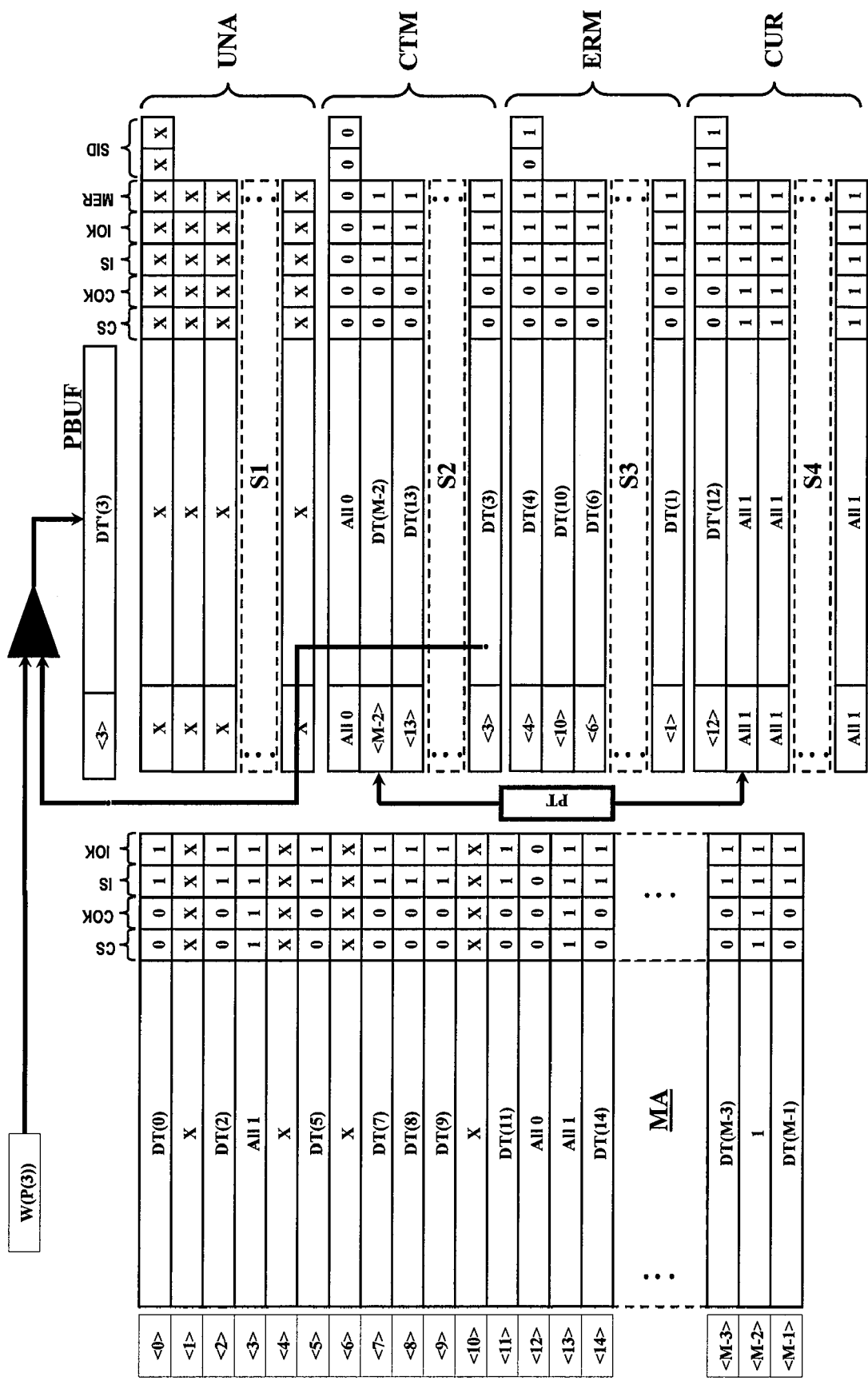
FIGS. 9A to 9H show a write-erase cycle, with a source page located in a sector of the auxiliary memory area.

FIG. 9A: The memory receives a command for writing a word W aiming at the target page P(3). The target page is in the erased state ("All 1", all the bits thereof are at 1) and the map VAM designates a source page in the sector CTM of virtual address <3>. The content DT(3) of the source page is copied out in the page buffer PBUF. The new word W is inserted therein to obtain updated page data DT'(3).

Figure 9B:
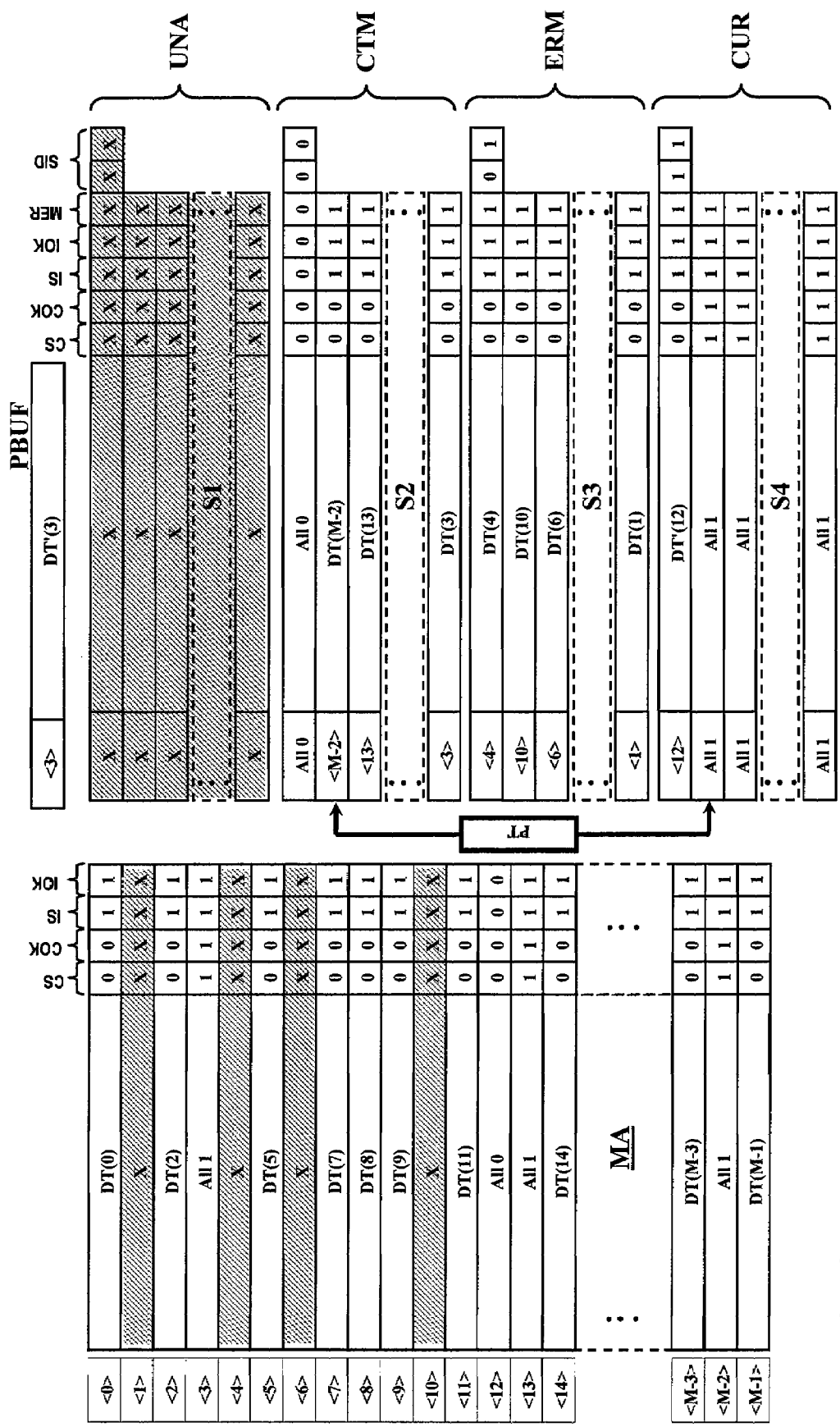

FIG. 9B: A new step of partial erasure is applied to the pages of the sector UNA and the pages of the MA area of addresses <1>, <4>, <6>, <10>. This is the second step of partial erasure and the pointer PT is positioned on the second page of the sector CTM or the second page of the sector CUR (according to the sector address SAD which is applied thereto). After this step of partial erasure, the pages of addresses <1>, <4>, <6>, <10> still contain data which are in an undetermined state "x".

Figure 9C:
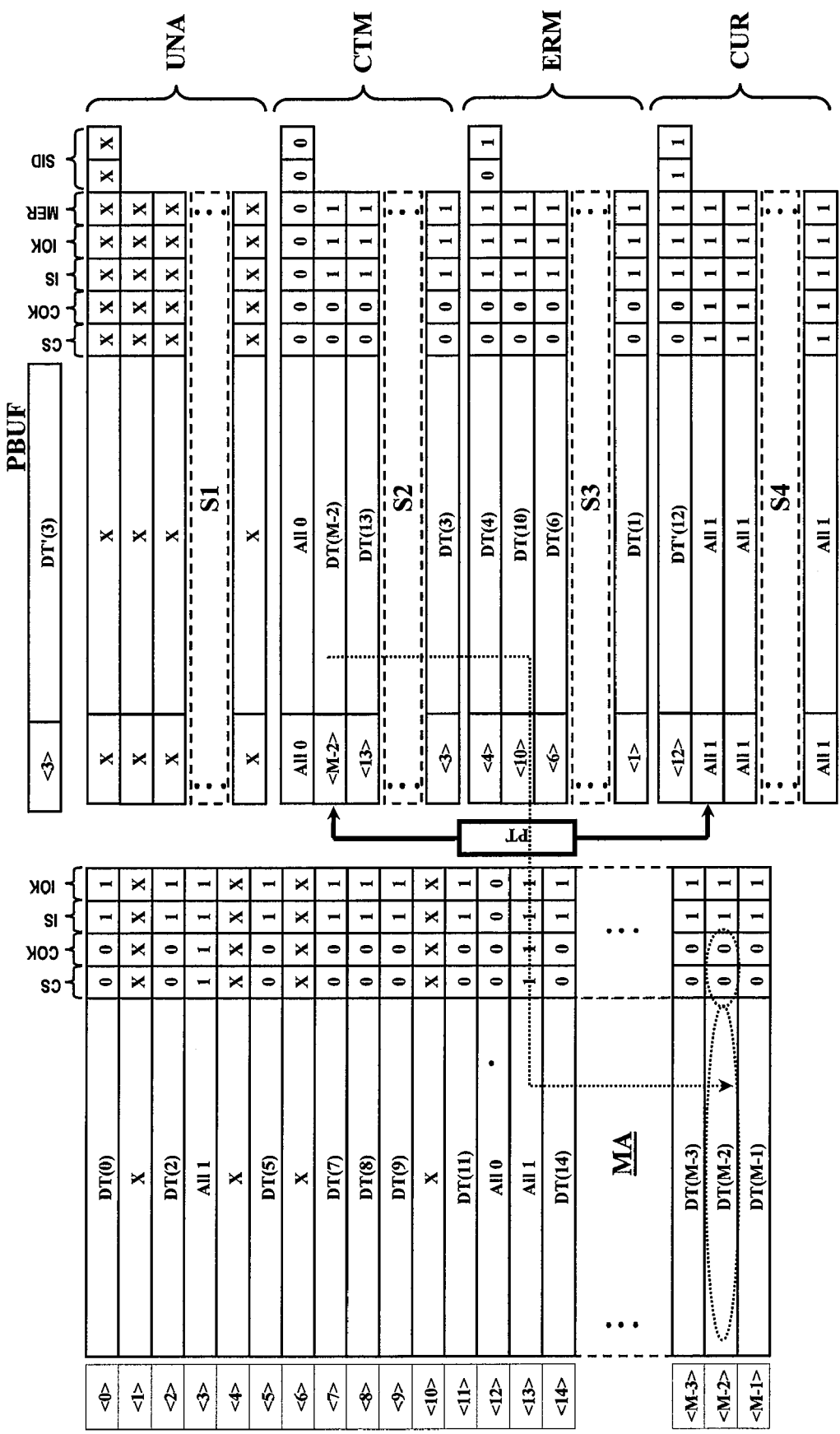

FIG. 9C: The address of the sector CTM is applied to the pointer PT, the output buffer SH is unlocked and the pointer designates the second page of the sector CTM. This page is valid (IS, IOK=1) and the address field thereof comprises the address <M−2> (virtual address of the page). The data of this page are therefore transferred to the page of physical address <M−2> of the MA area and the flags CS and COK thereof are reset.

Figure 9D:
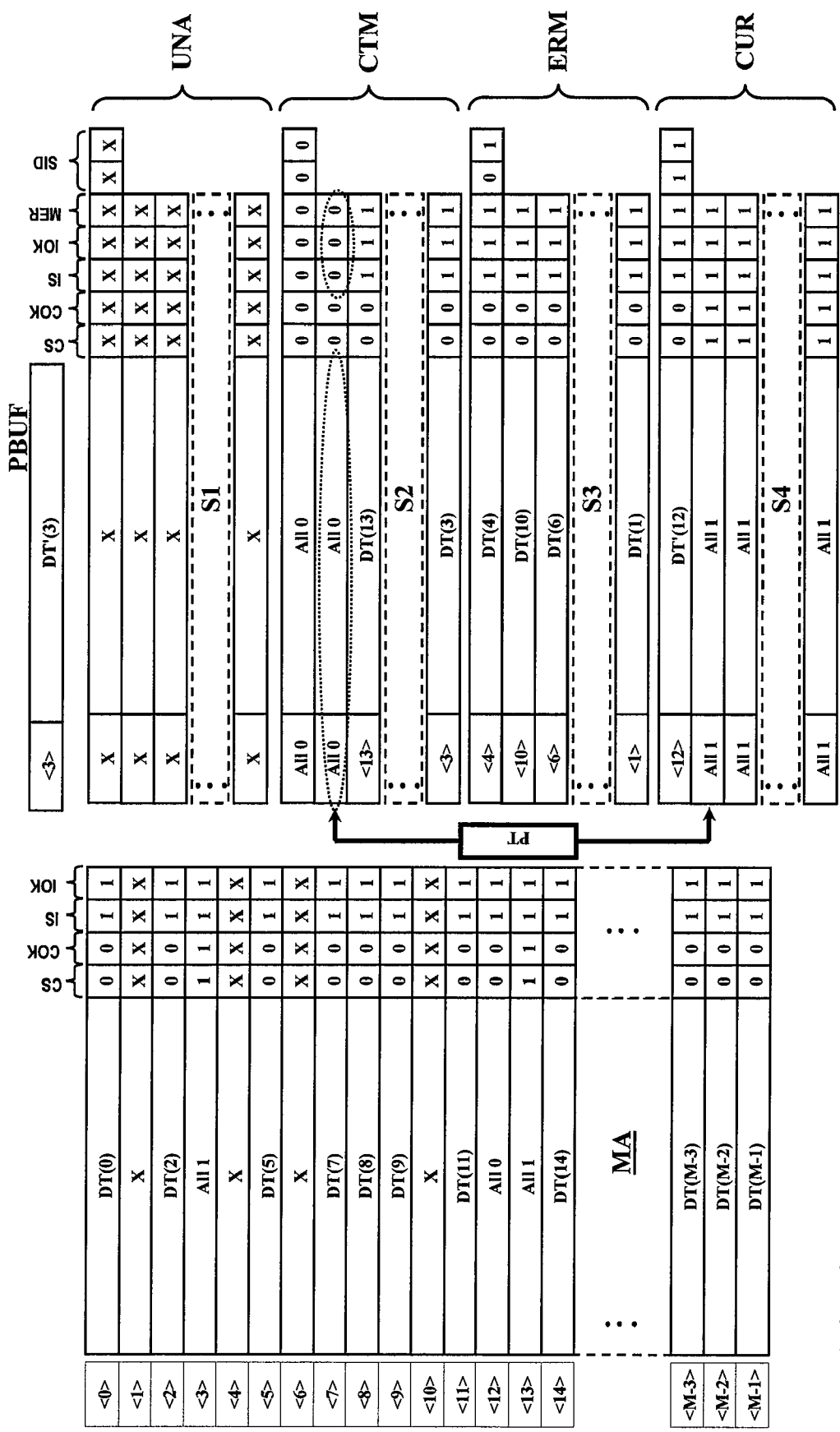

FIG. 9D: The page of virtual address <M−2> of the sector CTM is invalidated by successively switching to 0 the flag IS, then the data and address fields of the page, and the flags IOK and MER. The physical address of this page is removed from the map VAM.

Figure 9E:
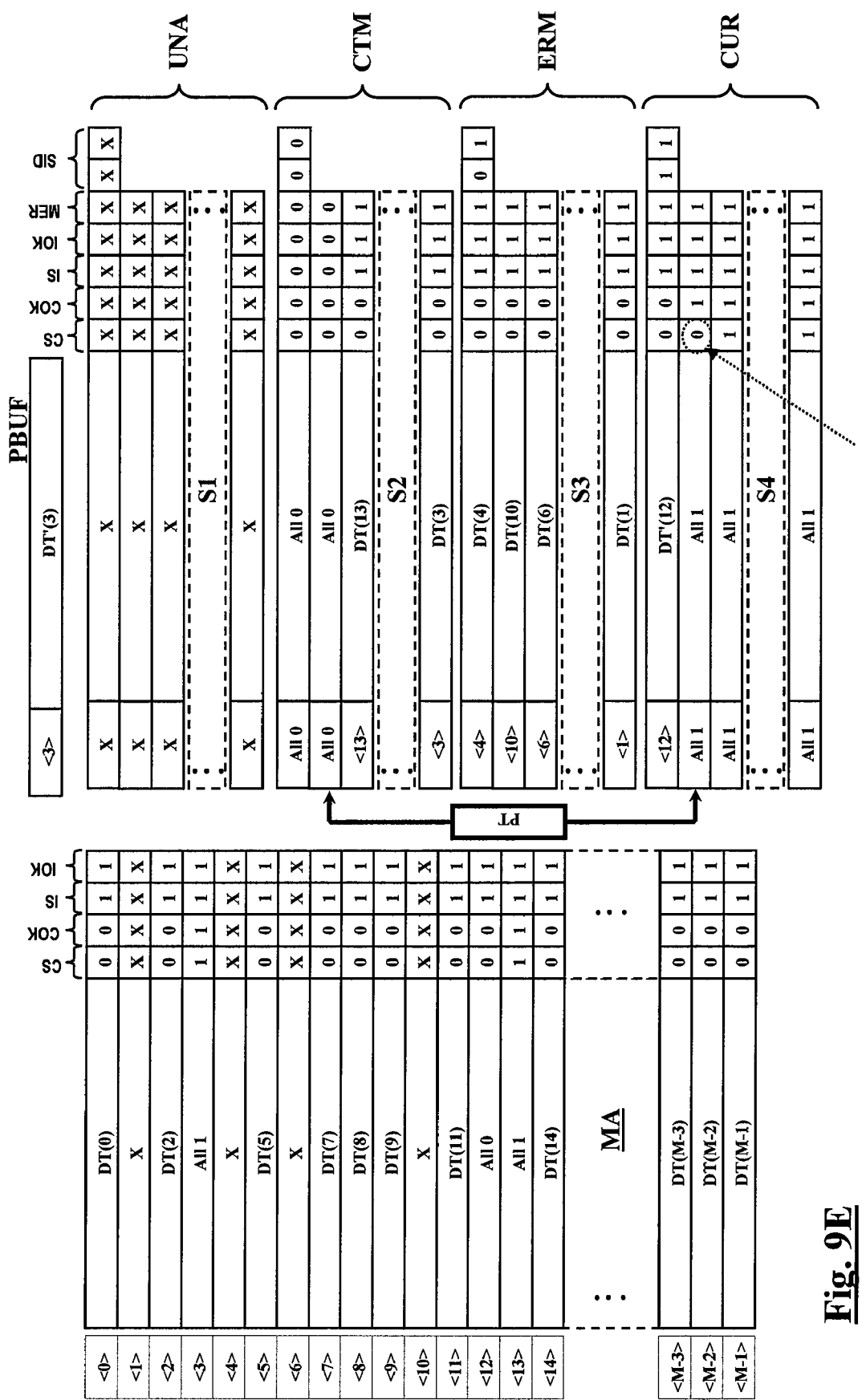

FIG. 9E: The control unit applies to the pointer PT the address of the sector CUR, the output buffer SH is unlocked and the pointer now designates the erased page of the sector CUR that may receive the updated page data, here the second page of the sector CUR. The flag CS of the page is switched to 0.

Figure 9F:
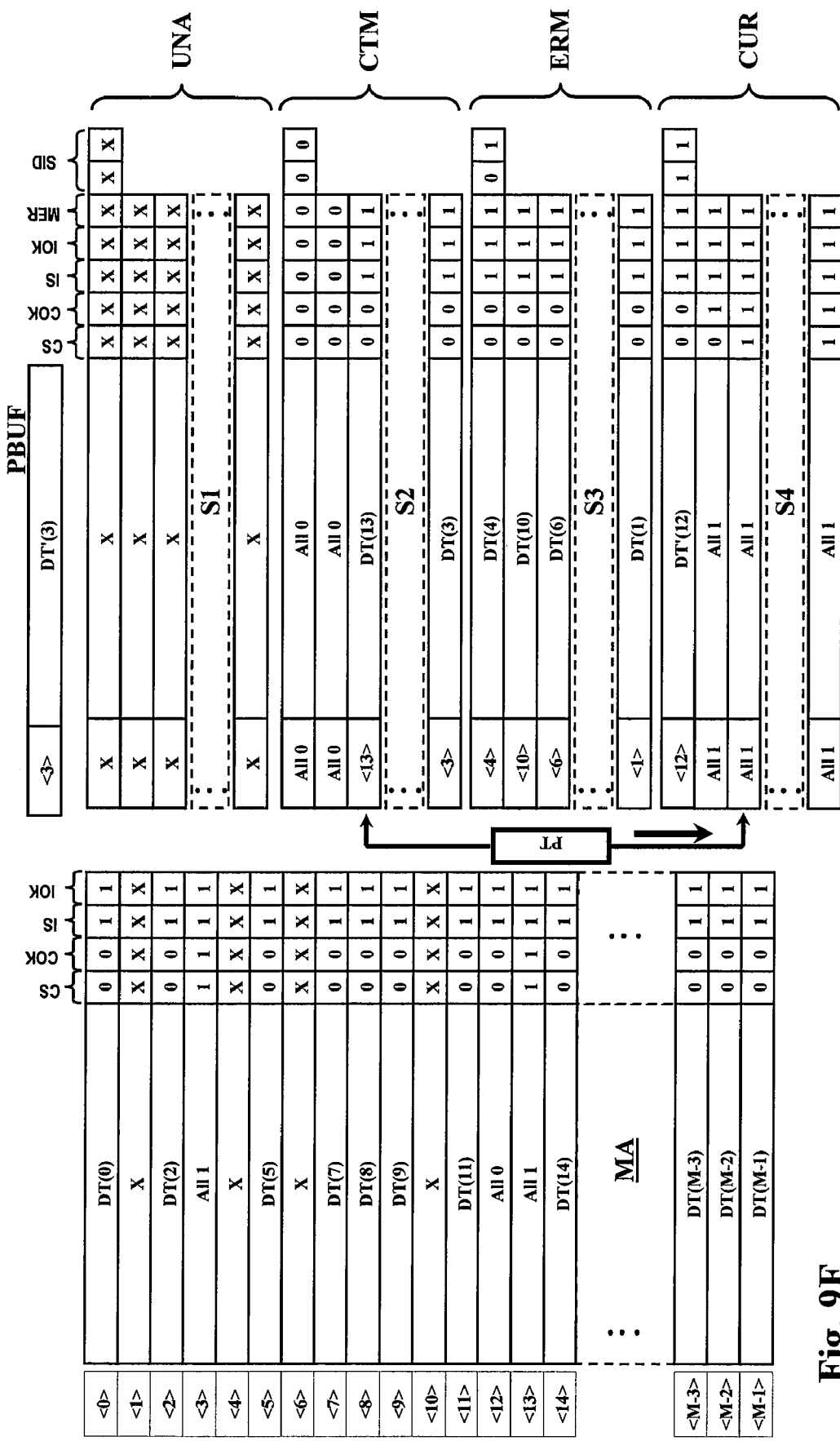

FIG. 9F: The pointer PT is incremented by applying the signal INCR to the counter CPT1 (FIG. 6) but the buffer SH is not unlocked.

Figure 9G:
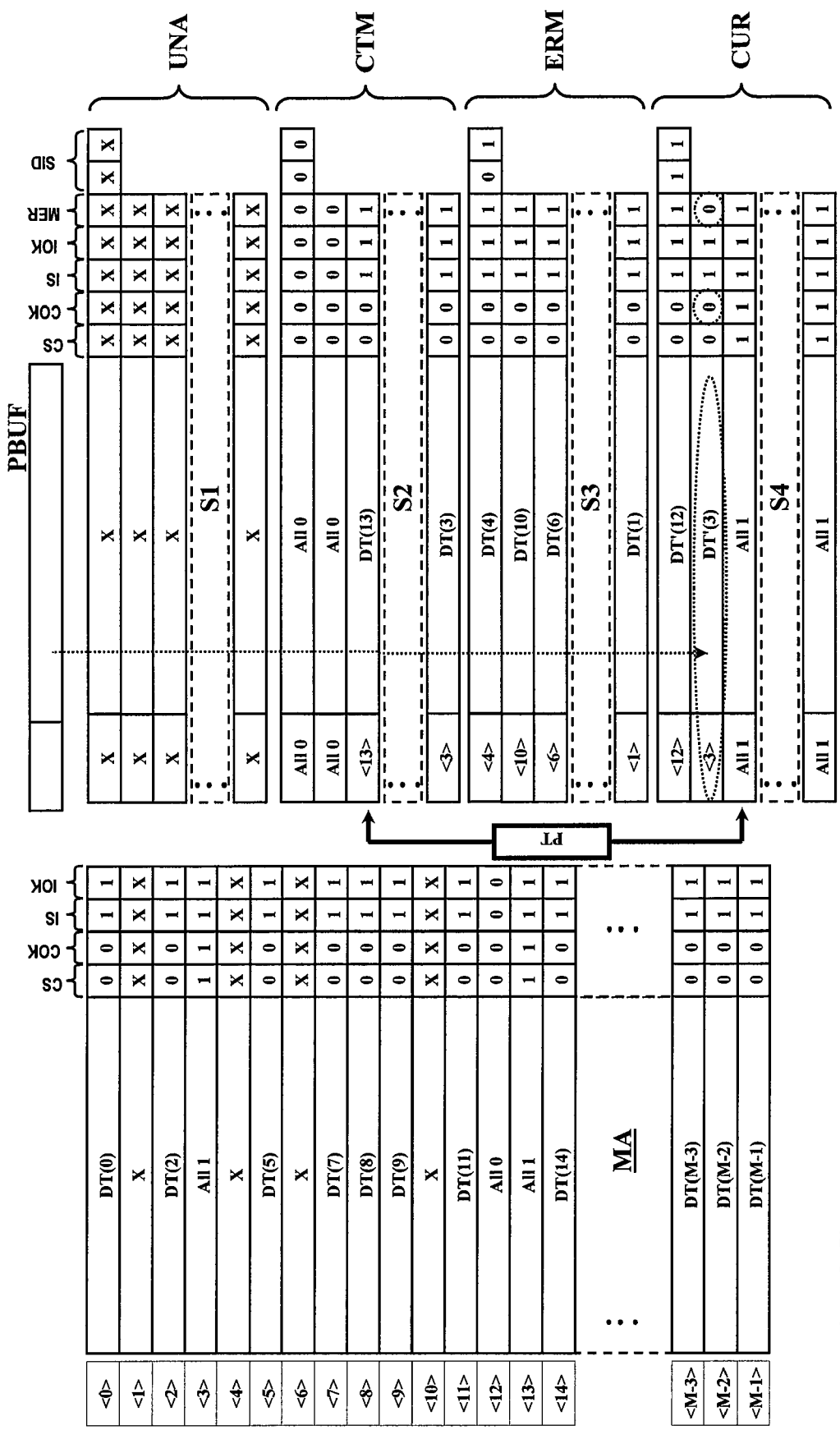

FIG. 9G: The updated page data DT'(3) present in the buffer PBUF, as well as the address <3> of the target page, are written in the erased page of the sector CUR. The flag COK is switched to 0. The flag MER is also switched to 0 because the source page belongs to the sector CTM and is thus linked to an erased page of the MA area. The page of landing in the sector CUR thus becomes a page of virtual address <3> but may be saved in the map VAM only after invalidating the source page.

Figure 9H:
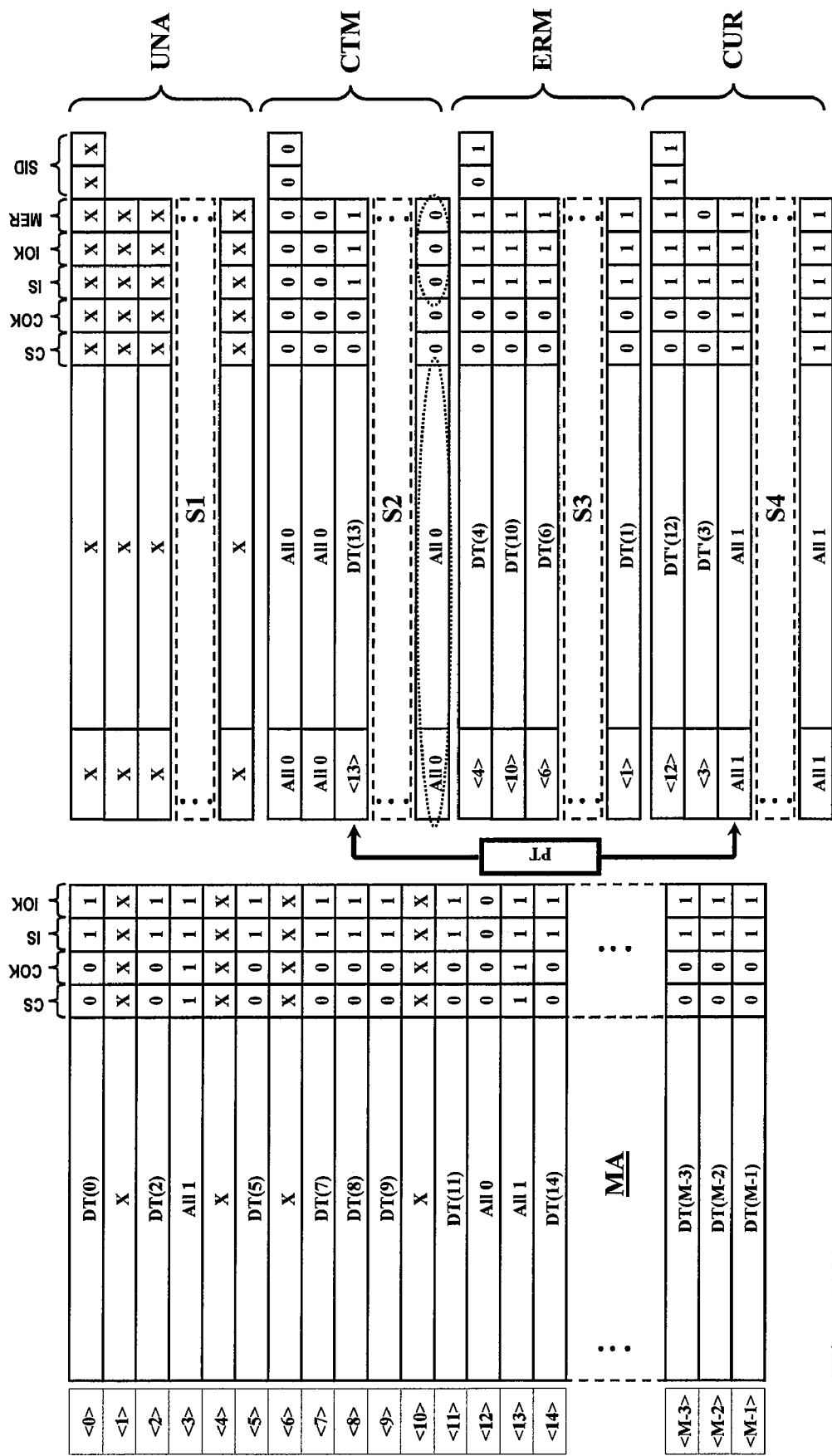

FIG. 9H: The source page of virtual address <3>, which physical address is supplied by the map VAM, is invalidated: switching the bit IS to 0, switching all page data to 0, switching the bit IOK to 0. The physical address thereof is then removed from the map VAM. The physical address of the new page of virtual address <3>, supplied by the pointer PT, is saved in the map VAM. It may be noted that passing from one page to another for the operations that have just been described is made by means of the multiplexer MX2 (FIG. 6) which makes it possible to alternately pass from an address of auxiliary page supplied by the map VAM to an address of auxiliary page supplied by the pointer PT.

EXAMPLE 3

Figure 10A:
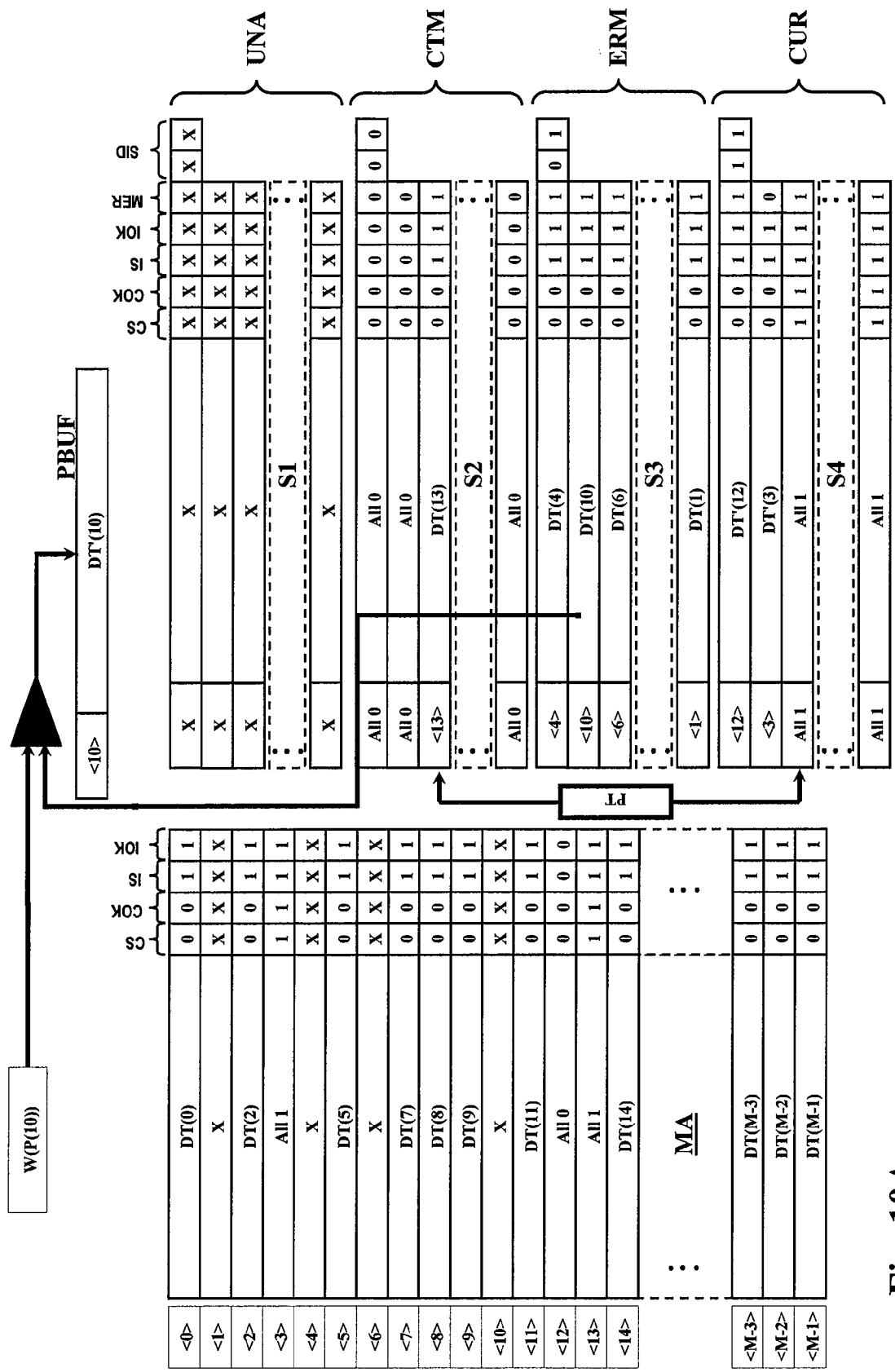
FIGS. 10A to 10C show a write-erase cycle, with a source page located in another sector of the auxiliary memory area.
Figure 10B:
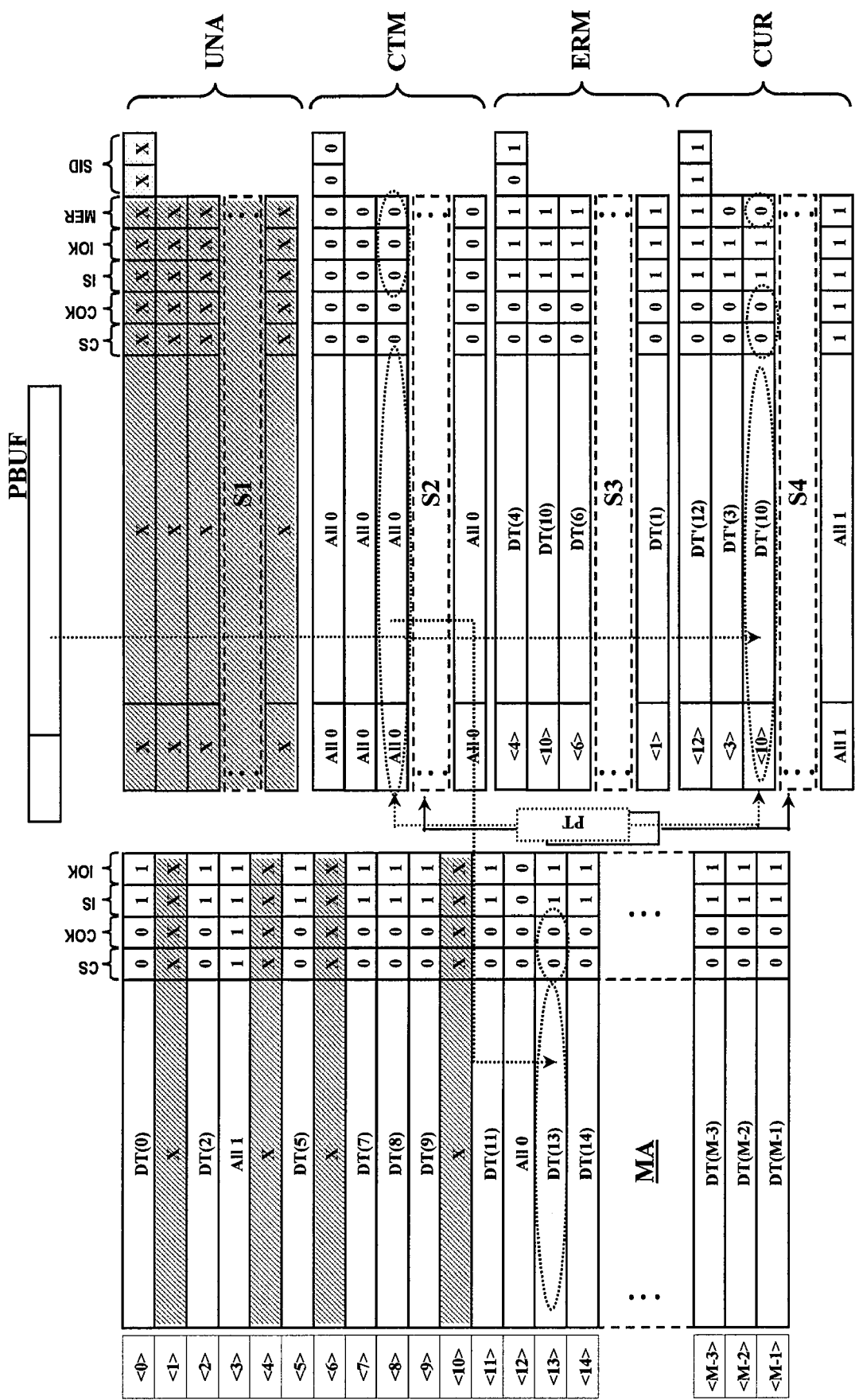
Figure 10C:
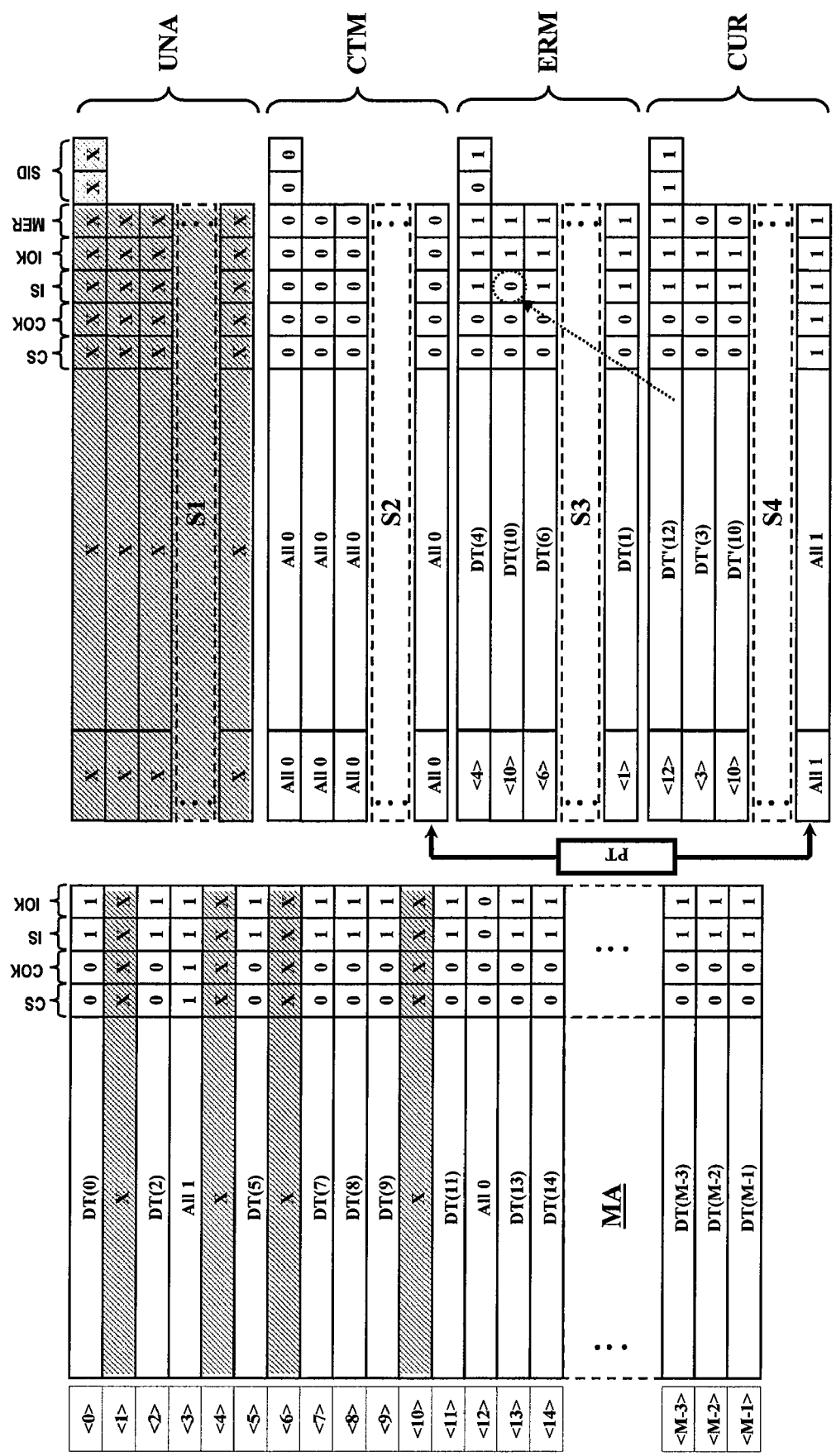

FIGS. 10A to 10C show the write-erase cycle in the case where the source page is in the sector ERM.

FIG. 10A: The memory receives a command for writing a word W aiming at the target page P(10). The target page is being erased (all the bits thereof are at the undetermined value "x") and the map VAM designates the source page of virtual address <10> in the sector ERM. The content DT(10) of the source page is copied out in the page buffer PBUF. The new word W is inserted therein to obtain updated page data DT'(10).

FIG. 10B: Several steps are shown and gathered in this figure. A new step of partial erasure is applied to the pages of the sector UNA and the pages of the MA area of addresses <1>, <4>, <6>, <10>. The address of the sector CTM is then applied to the pointer PT, the output buffer SH is unlocked and the pointer designates the third page of the sector CTM. The third page of the sector CTM is valid (IS, IOK=1). The address field of this page comprises the address <13>. The data of this page are thus transferred to the page of physical address <13> of the MA area. The flags CS and COK of this page are reset. The page of virtual address <13> of the sector CTM is then invalidated by successively switching the flag IS, then the data and address fields of the page, and the flags IOK and MER to 0. The physical address of this page is removed from the map VAM. The control unit then applies to the pointer PT the address of the sector CUR, the output buffer SH is unlocked and the pointer designates the erased page of the sector CUR that may receive the updated page data, here the third page of the sector CUR. The flag CS of the page is switched to 0. The internal value of the pointer PT is incremented. The updated page data DT'(10) in the buffer PBUF, as well as the address <10> of the target page, are written in the erased page of the sector CUR. The flag COK is switched to 0. The flag MER is also switched to 0 here, because the source page of virtual address <10> is in the sector ERM and the corresponding page of physical address <10> is being erased. The flag MER thus indicates that it may not be necessary to erase the corresponding page in the MA area when the sector CUR has the status of sector ERM (after the step of rotating the sectors).

FIG. 10C: The source page of virtual address <10> is invalidated by switching the bit IS to 0. However the remaining of the page is not reset because this page belongs to the sector ERM and the address field thereof may be necessary to regenerate the map EAM in the event of a power interruption. The physical address thereof is however removed from the map VAM. The address of the new page of virtual address <10> is saved in the map VAM.

EXAMPLE 4

FIGS. 11A to 11F show the write-erase cycle in the case where the source page is in the sector CUR.

Figure 11A:
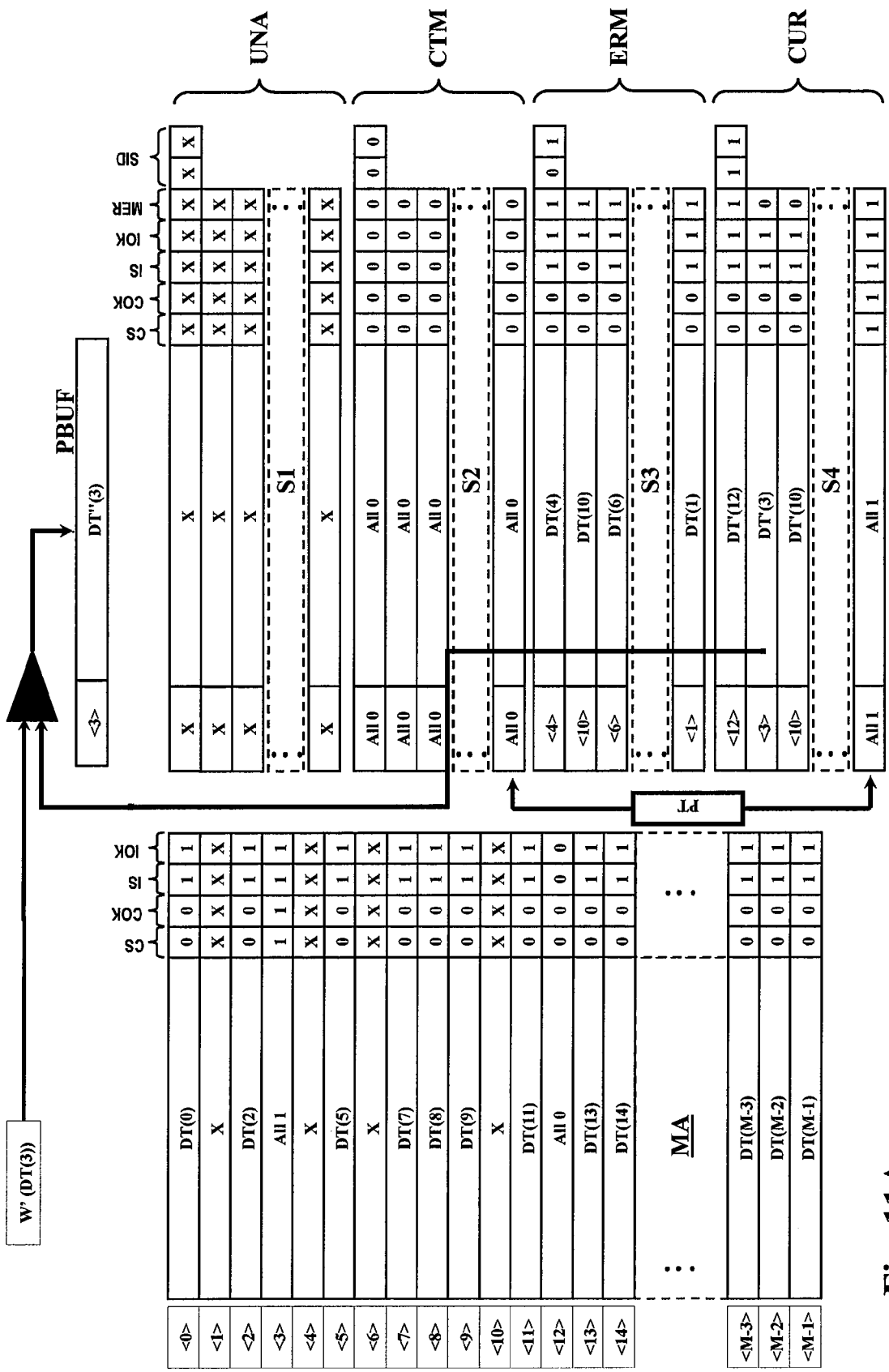
FIGS. 11A to 11F show a write-erase cycle, with a source page located in yet another sector of the auxiliary memory area.
Figure 11B:
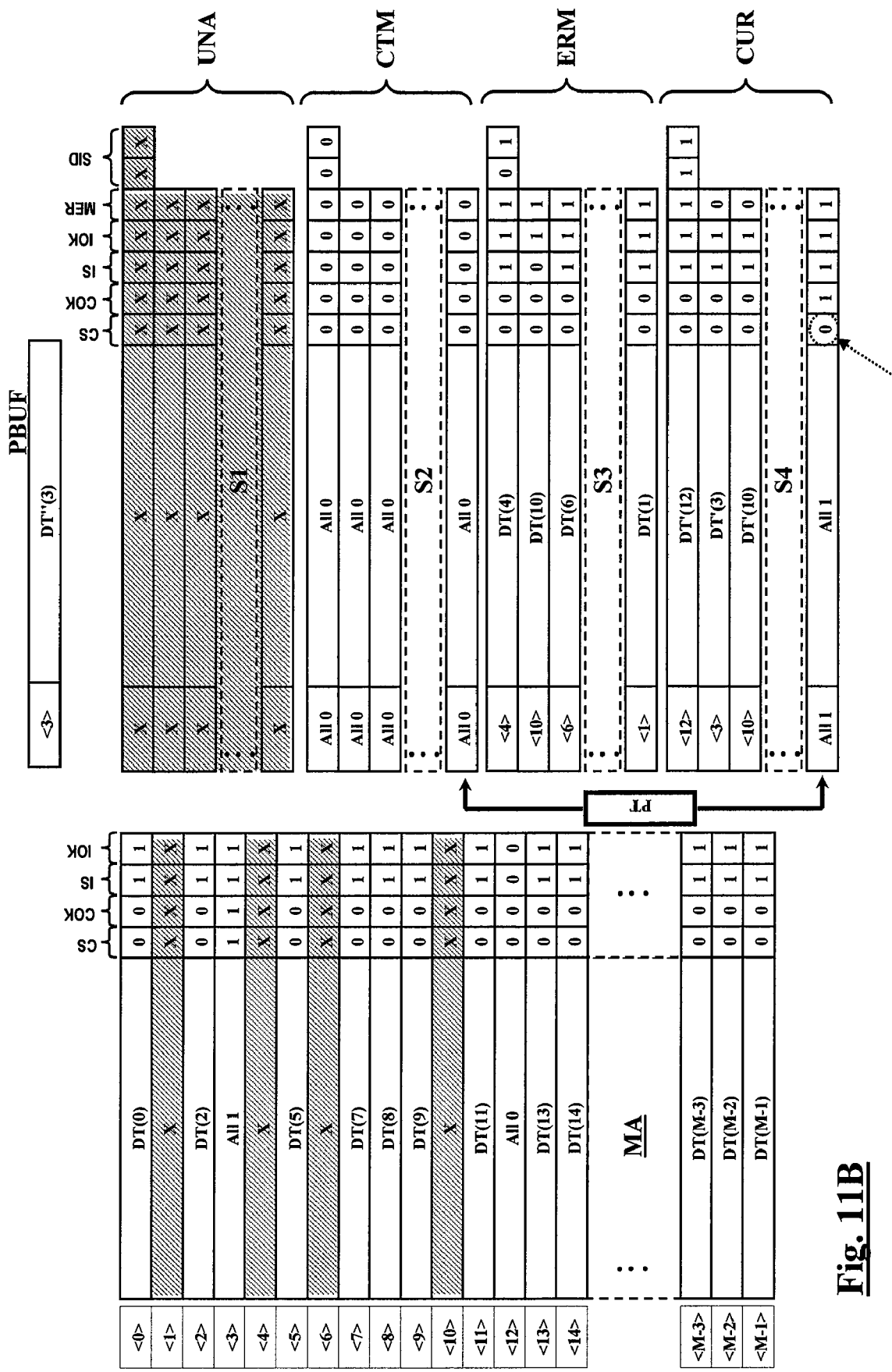

FIG. 11A: The memory receives a command for writing a word W aiming at the target page P(3). The target page is in the erased state and the map VAM designates a page of virtual address <3> in the sector CUR which is thus used as source page. This page has been updated lately (FIG. 9G). The content thereof DT'(3) is copied out in the page buffer PBUF. The new word W is inserted therein to obtain updated page data DT"(3).

Figure 11C:
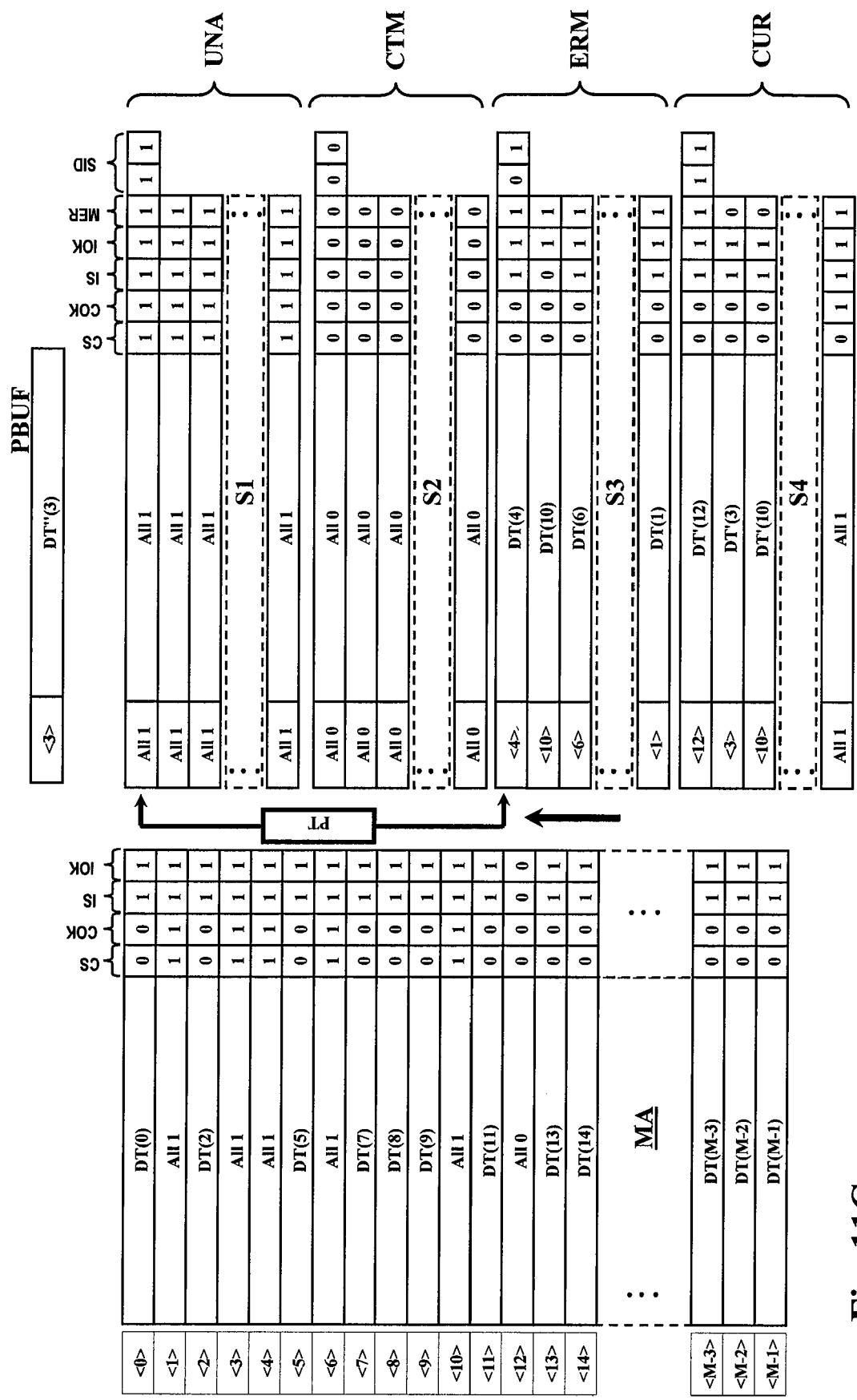

FIG. 11B:

i) A new step of partial erasure is applied to the pages of the sector UNA and the pages of the MA area of addresses <1>, <4>, <6>, <10>. This is the last step of partial erasure before rotating the sectors and the pointer PT is positioned on the last page of the sector CTM or the last page of the sector CUR (according to the sector address SAD which is applied thereto). After this last step, the pages of addresses <1>, <4>, <6>, <10> are completely erased and only contain data at 1 ("All 1", Cf. FIG. 11C).

ii) The address of the sector CTM is then applied to the pointer PT, the output buffer SH is unlocked and the pointer designates the last page of the sector CTM. This last page of the sector CTM only contains 0 ("All 0") because it has been invalidated lately (Cf. FIG. 9H). Consequently it is not transferred to the MA area.

iii) The control unit then applies to the pointer PT the address of the sector CUR, the output buffer SH is unlocked and the pointer now designates an erased page of the sector CUR that must receive the updated page data, here the last page of the sector CUR. The flag CS of the page is switched to 0.

FIG. 11C: The pointer PT is reset (resetting the least significant address thereof by applying the signal RST to the counter CPT1, FIG. 6) because the test "LSB(PT)=N−1" is positive (Cf. FIG. 7B Step 38). In other words, the pointer is reset because the least significant address LSB thereof, supplied by the counter CPT1, has reached the maximum value of the address field of the sectors.

Figure 11D:
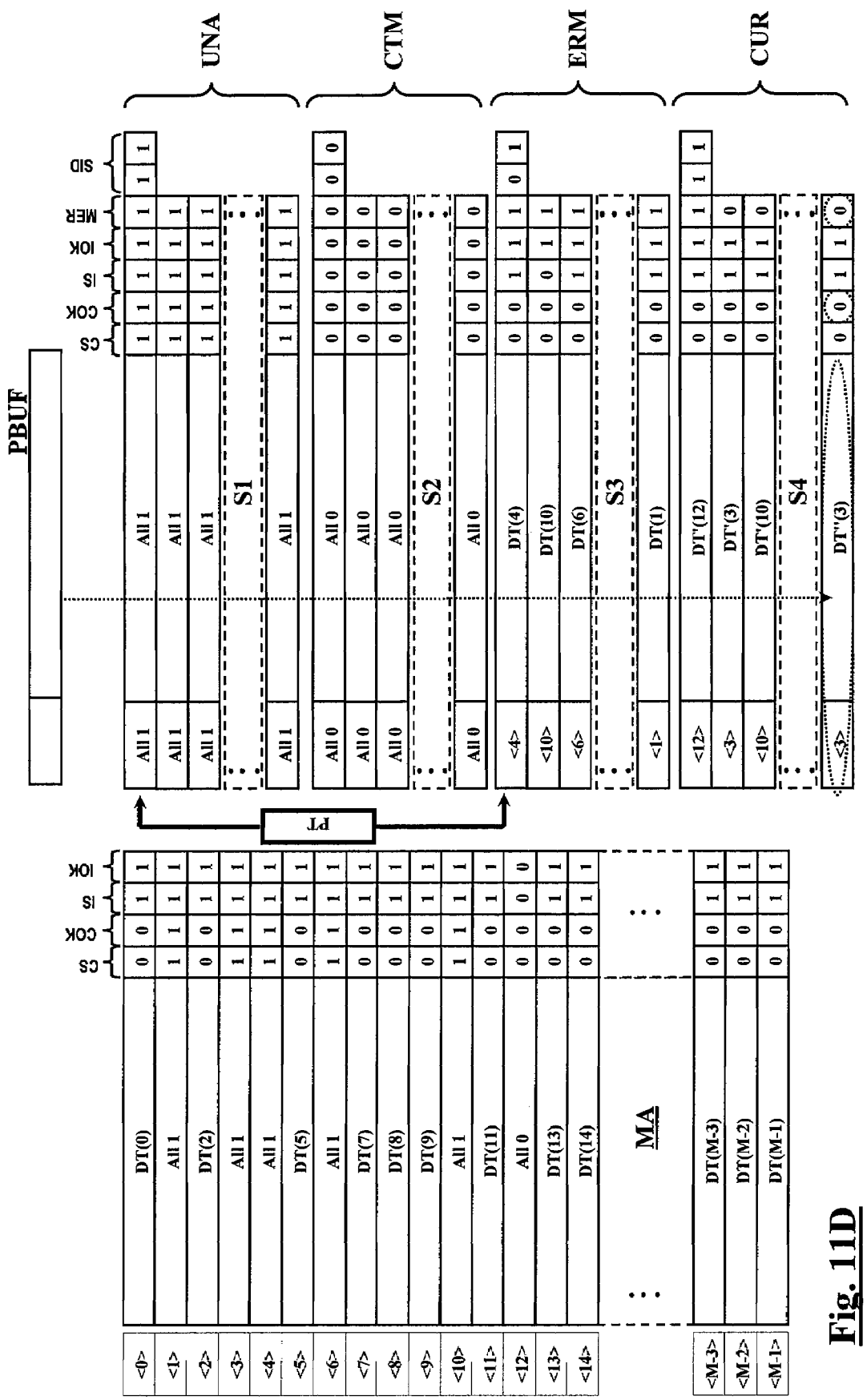

FIG. 11D: The updated page data DT"(3) present in the buffer PBUF, as well as the address <3> of the target page are written in the erased page of the sector CUR (the pointer going on supplying the physical address of this page until the buffer SH is unlocked). The flag COK is switched to 0. The flag MER is also reset because the flag MER of the source page is equal to 0. It can be seen indeed that the corresponding page in the MA area, of physical address <3> is now erased.

Figure 11E:
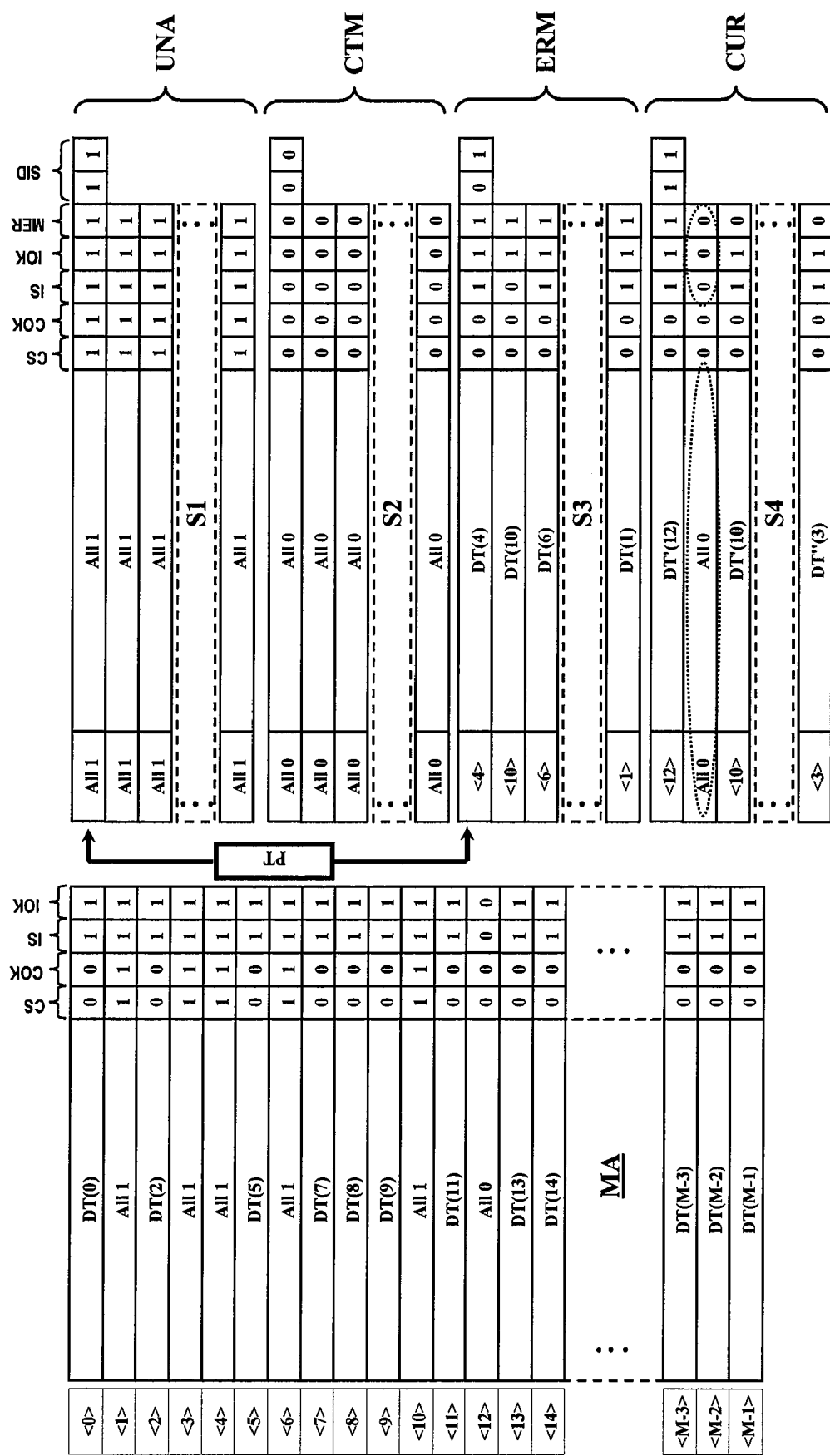

FIG. 11E: The source page of virtual address <3> is invalidated: switching the bit IS to 0, switching all page data to 0, switching the bit IOK to 0. The physical address thereof is removed from the map VAM. The physical address of the new page of virtual address <3>, supplied by the pointer PT, is saved in the map VAM.

Figure 11F:
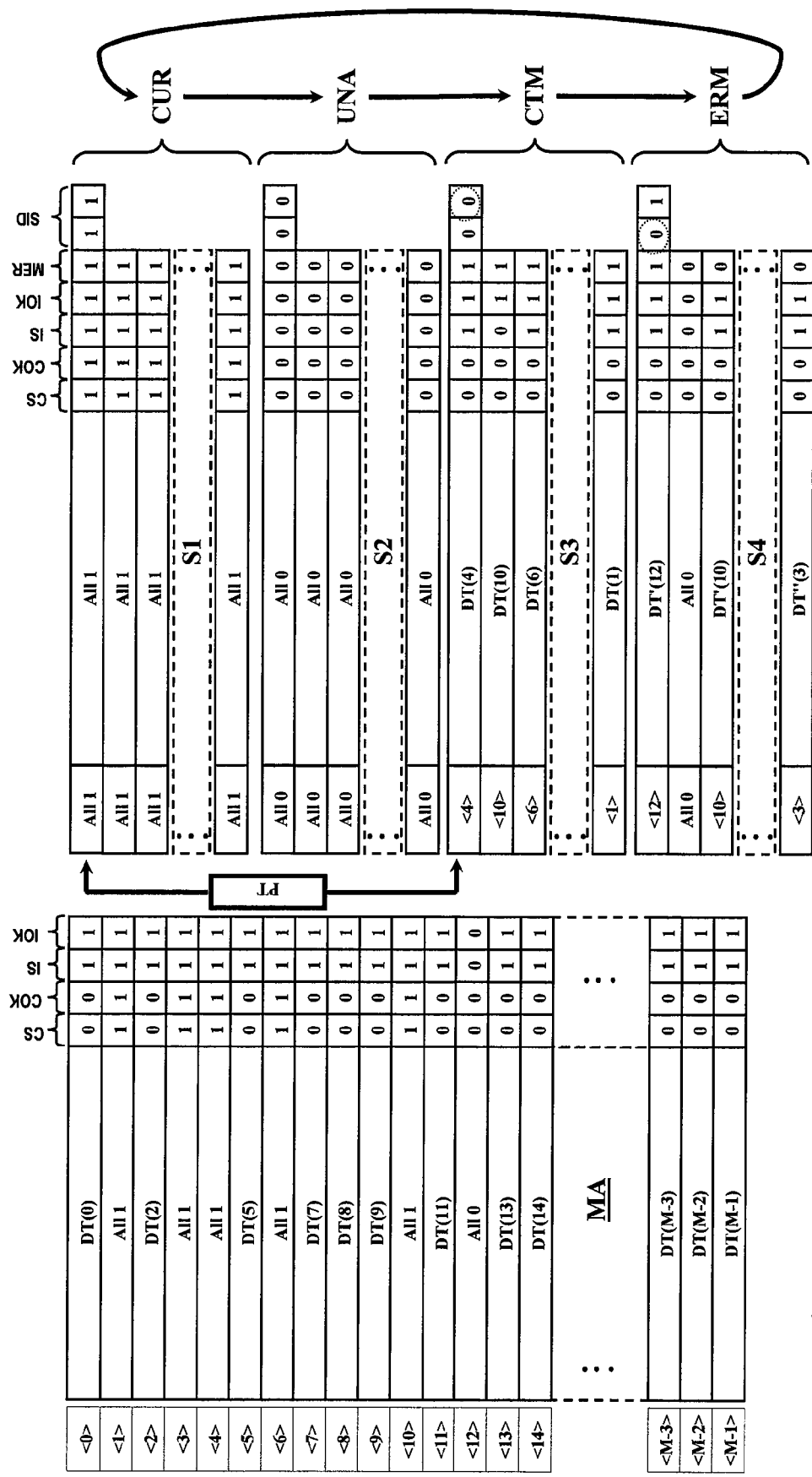

FIG. 11F: Rotating the sectors is performed by modifying the fields SID of the sectors S3 and S4. The second bit of the field SID of the sector S3 is reset and the first bit of the field SID of the sector S4 is reset. The sectors S1, S2, S3 and S4 respectively become the sectors CUR, UNA, CTM and ERM.

F—Embodiments and Applications

An embodiment of a memory has been previously described and gathers all the aspects described above, in particular:

Writing data in non-volatile auxiliary pages comprising an address field receiving the address of the corresponding target page, which allows in particular a volatile look-up table to be used and regenerated after a power interruption, Writing data in erased pages, to decrease the apparent erase time and/or limit the consequences of a power interruption, Providing a step of partial erasure, at each writing of a piece of data, to decrease the apparent erase time and/or avoid the reception of a flow of instructions from being interrupted, Providing non-volatile state flags (IS, IOK) for the invalidation of pages, Providing a redundancy of these flags to limit the consequences of a power interruption, Providing non-volatile state flags (CS, COK) to indicate the write steps and limit the consequences of a power interruption, Providing an auxiliary memory arranged in four sectors allowing a write-erase cycle comprising a step of emptying the auxiliary memory to be implemented, etc.

As it has already been emphasized, these aspects may be implemented independently of one another, according to the goals wanted and the target applications. For example, the aspects concerning the protection against tear-off (redundancy of flags IS, IOK and provision of flags CS, COK) are not necessary in an application where the risk of inopportune power interruption does not exist. Likewise, the aspects concerning the provision of the four sectors of the auxiliary area XA are advantageous to perform receiving an uninterrupted flow of instructions but the XA area may also comprise only two sectors CUR, CTM. In that case, erasing the sector CTM and the pages of the MA area linked to the pages of the sector CUR may be performed during a step of time off following the reception of N write commands, the sector CTM then becoming the sector CUR and the sector CUR becoming the sector CTM. In addition, the address fields in the auxiliary pages may not be necessary if a non-volatile map VAM is used. In addition, the order of the steps of write-erase cycle described above is susceptible of change, for example by performing transferring the pages of the sector CTM before the step of partial erasure, or the step of partial erasure after writing updated page data in the landing page, etc. Globally, those skilled in the art may think of various variations and embodiments implementing all or part of the invention.

In the previous description, embodiments have been implemented in a page-FLASH type memory, i.e., a memory divided into pages wherein the pages are erasable individually or by groups of pages individually selected, and wherein each page is divided into individually writable segments provided to receive each a binary word. It will be clear to those skilled in the art that this embodiment is not limiting and that the method may be implemented, for example, in a memory where data are written by page instead of being written by word (case where the granularity in writing is chosen to be equal to the granularity in erasing). In that case, the step of testing the target area has no essential purpose or the step of preparing the updated page data, since the data of each new page may overwrite the entire page data previously saved.

Also, the term "page" may not be interpreted in a limiting way as referring to a set of memory cells connected to a same word row controlled by a row decoder. The term "page" globally refers to a location which is individually erasable and comprises a plurality of memory cells. This location may be divided or not into individually writable segments. Besides, the word "sector" as used to refer to subdivisions of the memory area XA does not necessarily refer to physical sectors (different substrates) but may refer to logic sectors, even parts of an overall memory array including the MA and XA areas. In addition each aspect previously described constitutes per se an improvement susceptible of application without necessarily being combined with the other aspects. One embodiment allows embedded memories to be manufactured and in particular memories embedded into integrated circuits for chip cards or electronic tags. One embodiment allows FLASH memories like embedded memories to be used, this application has been dedicated to EEPROM memories up to now. One embodiment includes manufacturing a chip card or an electronic tag (of RFID or UHF contact or contactless type) comprising an integrated circuit equipped with a memory described above.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet, are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. Method, comprising:
 writing data in a non-volatile memory that includes a main memory area comprising target locations, and an auxiliary memory area comprising auxiliary locations, the writing including performing a write-erase cycle that includes:
  reading an initial set of data in a source location located in the main or auxiliary memory area,
  obtaining an updated set of data by inserting a piece of data to be written into the initial set of data, the piece of data to be written coming with an address of a first target location of the target locations,
  partially erasing a first group of auxiliary locations and a group of target locations designated by locations of a second group of auxiliary locations, and
  writing, in an erased auxiliary location of a third group of auxiliary locations, the updated set of data and the address of the first target location.

2. The method according to claim 1, further comprising writing data in erased locations of the third group of auxiliary locations and partially erasing the locations of the first group of auxiliary locations and the group of target locations designated by the second group of auxiliary locations until the locations of the first group of auxiliary locations and the group of target locations designated by the second group of auxiliary locations are completely erased.

3. The method according to claim 1, wherein performing the write-erase cycle also comprises declaring invalid the source location located in the main or auxiliary memory area.

4. The method according to claim 1, wherein the first group of auxiliary locations comprises a number of locations and the writing data in the non-volatile memory includes a number of steps of partial erasure used to completely erase the first group of auxiliary locations, the number of locations equaling the number of steps of partial erasure.

5. The method according to claim 1, wherein performing the write-erase cycle further comprises declaring as invalid the first target location.

6. The method according to claim 1, comprising:
 determining whether a portion of a second target location, to which a second piece of data is directed, is erased;
 if the portion is erased, directly writing the second piece of data in the second target location without performing the write-erase cycle for the second piece of data; and
 if the portion is not erased, triggering the write-erase cycle to write the second piece of data in an auxiliary location.

7. The method according to claim 1, wherein performing the write-erase cycle also comprises:
 transferring, to a second target location of the target locations, a second piece of data located in an auxiliary location of a fourth group of auxiliary locations if the second piece of data is not declared invalid, and
 declaring invalid the auxiliary location of the fourth group of auxiliary locations when the second piece of data has been transferred to the second target location.

8. The method according to claim 7, comprising providing, in the auxiliary memory area:
 a current sector forming the third group of auxiliary locations which are in an erased state,
 a save sector forming the second group of auxiliary locations to which steps of partial erasure are applied,
 a transfer sector forming a fourth group of auxiliary locations which contain data to be transferred to respective target locations associated with the auxiliary locations of the fourth group, and
 an unavailable sector forming the first group of auxiliary locations which include invalid auxiliary locations to which steps of partial erasure are applied.

9. The method according to claim 8 comprising, after completely erasing the unavailable sector, rotating sectors comprising:
- declaring as current sector the sector that was previously the unavailable sector,
- declaring as save sector the sector that was previously the current sector,
- declaring as transfer sector the sector that was previously the save sector, and
- declaring as unavailable sector the sector that was previously the transfer sector.

10. A non-volatile memory, comprising:
a main memory area including target locations;
an auxiliary memory area including auxiliary locations; and
a control unit configured to, upon receiving a command for writing a first piece of data in a first target location, of the target locations, coming with an address of the first target location, apply to the memory a write-erase cycle including:
- reading an initial set of data in a source location located in the main or auxiliary memory area,
- obtain an updated set of data by inserting the first piece of data in the initial set of data,
- partially erasing a first group of auxiliary locations and a group of the target locations designated by locations of a second group of auxiliary locations, and
- writing, in an erased auxiliary location of a third group of auxiliary locations, the updated set of data and the address of the first target location.

11. The memory according to claim 10, wherein the control unit includes means for writing data in erased locations of the third group of auxiliary locations and partially erasing the locations of the first group of auxiliary locations and the group of target locations designated by the second group of auxiliary locations until the locations of the first group of auxiliary locations and the group of target locations designated by the second group of auxiliary locations are completely erased.

12. The memory according to claim 10, wherein the control unit is configured to include in the write-erase cycle a step of declaring invalid the source location located in the main or auxiliary memory area.

13. The memory according to claim 10, wherein the first group of auxiliary locations comprises a number of locations and the control unit is configured to perform a number of steps of partial erasure to completely erase the first group of locations, the number of locations equaling the number of steps of partial erasure.

14. The memory according to claim 10, wherein the control unit is configured to include in the write-erase cycle a step of declaring as invalid the target location.

15. The memory according to claim 10, wherein each location comprises an invalidation flag, and the control unit is configured to invalidate a location by setting the invalidation flag of the location being invalidated at a programming logic value.

16. The memory according to claim 10, wherein the control unit is configured to, in response to a write command for writing a second piece of data:
- determine whether a portion of a second target location, to which a second piece of data is direct, is erased,
- if the portion is erased, directly write the second piece of data in the second target location without triggering the write-erase cycle for the second piece of data, and
- if the portion is not erased, apply the write-erase cycle to write the second piece of data in an auxiliary location.

17. The memory according to claim 10, wherein the control unit is configured to include in the write-erase cycle:
- transferring, to a second target location of the target locations, a second piece of data located in an auxiliary location of a fourth group of auxiliary locations if the second piece of data is not declared invalid, and
- declaring invalid the auxiliary location of the fourth group of auxiliary locations when the second piece of data has been transferred to the second target location.

18. The memory according to claim 17, wherein the auxiliary memory area comprises:
- a current sector forming the third group of auxiliary locations and comprising erased auxiliary locations used by the control unit to write data,
- a save sector forming the second group of auxiliary locations and comprising auxiliary locations containing data linked to target locations to which the control unit applies steps of partial erasure and the addresses of the target locations,
- a transfer sector forming the fourth group of auxiliary locations and comprising auxiliary locations containing data to be transferred to the respective target locations thereof, and
- an unavailable sector forming the first group of auxiliary locations and comprising invalid auxiliary locations to which the control unit applies steps of partial erasure.

19. The memory according to claim 18, wherein the control unit is configured to, after completely erasing the unavailable sector:
- declare as current sector the sector that was previously the unavailable sector,
- declare as save sector the sector that was previously the current sector,
- declare as transfer sector the sector that was previously the save sector, and
- declare as unavailable sector the sector that was previously the transfer sector.

20. The memory according to claim 10, wherein each location is the smallest set of memory cells which may be individually erased.

21. The memory according to claim 10, wherein each location is a page of the memory defined by a row address.

22. An integrated circuit, comprising:
a non-volatile memory that includes:
- a main memory area including target locations;
- an auxiliary memory area including auxiliary locations; and
- a control unit configured to, upon receiving a command for writing a first piece of data in a first target location, of the target locations, coming with an address of the first target location, apply to the memory a write-erase cycle including:
  - reading an initial set of data in a source location located in the main or auxiliary memory area,
  - obtain an updated set of data by inserting the first piece of data in the initial set of data,
  - partially erasing a first group of auxiliary locations and a group of the target locations designated by locations of a second group of auxiliary locations, and
  - writing, in an erased auxiliary location of a third group of auxiliary locations, the updated set of data and the address of the first target location.

23. The integrated circuit according to claim 22, wherein the integrated circuit is a chipcard or electronic tag.

24. The integrated circuit according to claim 22, wherein the control unit includes means for writing data in erased locations of the third group of auxiliary locations and partially erasing the locations of the first group of auxiliary locations and the group of target locations designated by the second group of auxiliary locations until the locations of the first group of auxiliary locations and the group of target locations designated by the second group of auxiliary locations are completely erased.

25. The integrated circuit according to claim 22, wherein the first group of auxiliary locations comprises a number of locations and the control unit is configured to perform a number of steps of partial erasure to completely erase the first group of locations, the number of locations equaling the number of steps of partial erasure.

26. The integrated circuit according to claim 22, wherein the control unit is configured to, in response to a write command for writing a second piece of data:
   determine whether a portion of a second target location, to which a second piece of data is direct, is erased,
   if the portion is erased, directly write the second piece of data in the second target location without triggering the write-erase cycle for the second piece of data, and
   if the portion is not erased, apply the write-erase cycle to write the second piece of data in an auxiliary location.

27. The integrated circuit according to claim 22, wherein the control unit is configured to include in the write-erase cycle:
   transferring, to a second target location of the target locations, a second piece of data located in an auxiliary location of a fourth group of auxiliary locations if the second piece of data is not declared invalid, and
   declaring invalid the auxiliary location of the fourth group of auxiliary locations when the second piece of data has been transferred to the second target location.

28. The integrated circuit according to claim 27, wherein the auxiliary memory area comprises:
   a current sector forming the third group of auxiliary locations and comprising erased auxiliary locations used by the control unit to write data,
   a save sector forming the second group of auxiliary locations and comprising auxiliary locations containing data linked to target locations to which the control unit applies steps of partial erasure and the addresses of the target locations,
   a transfer sector forming the fourth group of auxiliary locations and comprising auxiliary locations containing data to be transferred to the respective target locations thereof, and
   an unavailable sector forming the first group of auxiliary locations and comprising invalid auxiliary locations to which the control unit applies steps of partial erasure.

29. The integrated circuit according to claim 28, wherein the control unit is configured to, after completely erasing the unavailable sector:
   declare as current sector the sector that was previously the unavailable sector,
   declare as save sector the sector that was previously the current sector,
   declare as transfer sector the sector that was previously the save sector, and
   declare as unavailable sector the sector that was previously the transfer sector.

30. The integrated circuit according to claim 22, wherein each location is a page of the memory defined by a row address.

* * * * *